US011475958B2

(12) United States Patent
Lien et al.

(10) Patent No.: US 11,475,958 B2
(45) Date of Patent: Oct. 18, 2022

(54) NEGATIVE BIT LINE BIASING DURING QUICK PASS WRITE PROGRAMMING

(71) Applicant: SanDisk Technologies LLC, Addison, TX (US)

(72) Inventors: Yu-Chung Lien, San Jose, CA (US); Huai-yuan Tseng, San Ramon, CA (US); Swaroop Kaza, San Jose, CA (US); Tomer Eliash, Sunnyvale, CA (US)

(73) Assignee: SanDisk Technologies LLC, Addison, TX (US)

(*) Notice: Subject to any disclaimer, the term of this patent is extended or adjusted under 35 U.S.C. 154(b) by 42 days.

(21) Appl. No.: 17/192,598

(22) Filed: Mar. 4, 2021

(65) Prior Publication Data

US 2022/0284965 A1 Sep. 8, 2022

(51) Int. Cl.
*G11C 11/00* (2006.01)
*G11C 16/10* (2006.01)
*G11C 16/30* (2006.01)
*G11C 16/24* (2006.01)
*G11C 16/26* (2006.01)

(52) U.S. Cl.
CPC .............. *G11C 16/10* (2013.01); *G11C 16/24* (2013.01); *G11C 16/26* (2013.01); *G11C 16/30* (2013.01)

(58) Field of Classification Search
CPC ......... G11C 16/10; G11C 16/24; G11C 16/26; G11C 16/30
See application file for complete search history.

(56) References Cited

U.S. PATENT DOCUMENTS

| 8,611,155 | B2* | 12/2013 | Kim | .................. | G11C 16/3454 |
| | | | | | 365/185.19 |
| 8,982,638 | B2* | 3/2015 | Baik | .................. | G11C 16/0483 |
| | | | | | 365/185.23 |
| 10,665,313 | B1* | 5/2020 | Lu | ...................... | G11C 11/5642 |

* cited by examiner

*Primary Examiner* — Pho M Luu
(74) *Attorney, Agent, or Firm* — Dickinson Wright PLLC; Steven C. Hurles

(57) ABSTRACT

A method of operating a memory system includes a first programming loop, which includes applying a first programming voltage to a control gate of a selected word line and applying a first bitline voltage to a bitline coupled to a first memory cell that is being programmed to a first data state and to a different bitline coupled to a second memory cell that is being programmed to a second data state. In a second programming loop, a second bitline voltage is applied to the bitline coupled to the first memory cell, and a third bitline voltage is applied to the bitline coupled to the second memory cell. The second bitline voltage is greater than the first bitline voltage to reduce a programming speed of the first bitline voltage to increase a programming speed of the second memory cell.

20 Claims, 23 Drawing Sheets

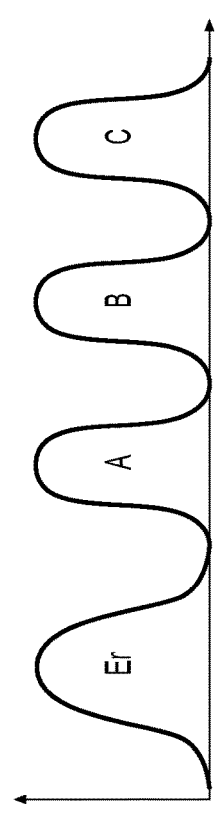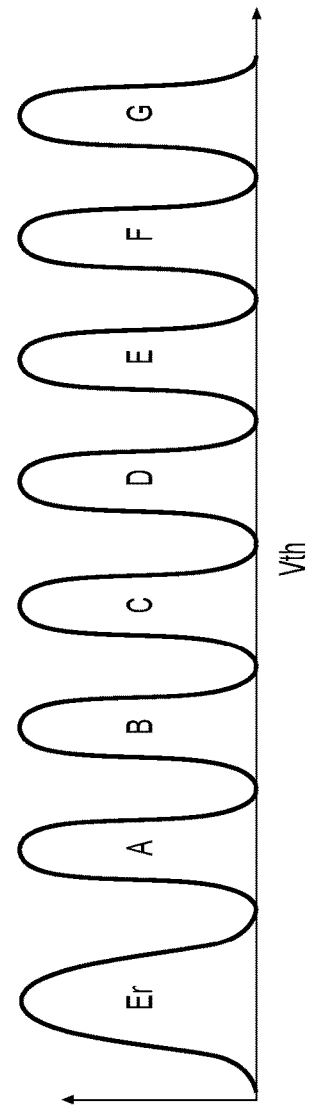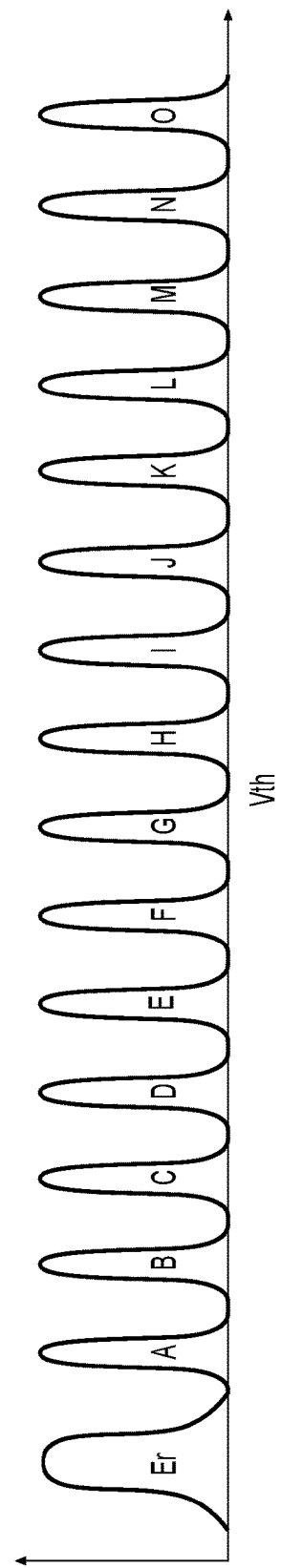

PROGRAM-SELECTED STRING

NEGATIVE BIT LINE BIASING DURING QUICK PASS WRITE PROGRAMMING

BACKGROUND

Field

The present technology relates to the operation of memory devices.

Related Art

Memory devices are typically provided as internal, semiconductor, integrated circuits in computers or other electronic devices. There are many different types of memory, including random-access memory (RAM), read only memory (ROM), dynamic random-access memory (DRAM), synchronous dynamic random-access memory (SDRAM), an electrically erasable programmable read-only memory (EEPROM), a flash memory, and/or the like. In an EEPROM or flash NAND array architecture, memory cells may be arranged in a matrix of rows and columns such that gates of each memory cell are coupled by rows to word lines. The memory cells may be arranged together in strings such that memory cells in a given string are coupled together in series, from source to drain, between a common source line and a common bit line.

SUMMARY

As discussed in further detail below, the technologies described herein are capable of programming different the set of memory cells in a selected word line at different speeds to effectuate slower, more accurate (QPW) programming of some of the memory cells and faster (reverse QPW) programming of other memory cells. This conserves resources (e.g., processing resources, memory resources, and/or the like) by reducing program and verify operation execution time as compared to other known systems and methods (e.g., that require more voltage pulses to program, that has a higher total programming time, etc.), and these performance advantages also are achieved without a sacrifice in programming reliability.

One aspect of the present disclosure is related to a method of programming a memory apparatus. The method includes a first programming loop that includes applying a first programming voltage to a control gate of a selected word line. The first programming loop also includes applying a first bitline voltage to a bitline coupled to a first memory cell that is being programmed to a first data state and to a different bitline coupled to a second memory cell that is being programmed to a second data state. The method further includes a second programming loop that includes applying a second programming voltage to the control gate of the selected word line. The second programming loop further includes simultaneously applying a second bitline voltage to the bitline coupled to the first memory cell and applying a third bitline voltage to the bitline coupled to the second memory cell. The second bitline voltage is greater than the first bitline voltage to reduce a programming speed of the first memory cell, and the third bitline voltage is less than the first bitline voltage to increase a programming speed of the second memory cell.

According to another aspect of the present disclosure, the third bitline voltage is a negative voltage.

According to yet another aspect of the present disclosure, the first memory cell is in a first subset of memory cells that are being programmed to a first data state and the second memory cell is in a second subset of memory cells that are being programmed to a second data state that is at a higher voltage than the first data state. The method further includes the step of simultaneously applying the second bitline voltage to all bitlines coupled to the first subset of memory cells and applying the third bitline voltage to all bitlines coupled to the second subset of memory cells.

According to still another aspect of the present disclosure, the memory apparatus further includes a third subset of memory cells that are being programmed to a third data state that is at a higher voltage than the second data state. The method further includes a third programming loop that includes simultaneously applying the second bitline voltage to all bitlines coupled to the second subset of memory cells and applying the third bitline voltage to all bitlines coupled to the third subset of memory cells.

According to a further aspect of the present disclosure, the third programming loop further includes applying an inhibit bitline voltage to all bitlines coupled to the first subset of memory cells to inhibit programming of the first subset of memory cells during the third programming loop.

According to yet a further aspect of the present disclosure, the first bitline voltage is a ground voltage.

According to still a further aspect of the present disclosure, the second programming loop further includes applying an inhibit bitline voltage to at least one bitline coupled to an additional memory cell to inhibit programming of the additional memory cell.

According to another aspect of the present disclosure, the second programming voltage is greater than the first programming voltage.

Another aspect of the present disclosure is related to an apparatus that includes a plurality of memory cells. Each of the memory cells is connected to one of a plurality of word lines, one of a plurality of bit lines, is arranged in a plurality of blocks, and is configured to retain a threshold voltage corresponding to one of a plurality of data states. The apparatus further includes a control circuit that is coupled to the plurality of word lines and the plurality of bit lines and is configured to perform a first programming loop and a second programming loop. The first programming loop includes applying a first programming voltage to a control gate of a selected word line and applying a first bitline voltage to a bitline coupled to a first memory cell being programmed to a first data state and to a bitline coupled to a second memory cell being programmed to a second data state. The second programming loop includes applying a second programming voltage to a control gate of the selected word line. The second programming loopfurther includes simultaneously applying a second bitline voltage to the bitline coupled to the first memory cell and applying a third bitline voltage to the bitline coupled to the second memory cell. The second bitline voltage is greater than the first bitline voltage to reduce a programming speed of the first memory cell, and the third bitline voltage is less than the first bitline voltage to increase a programming speed of the second memory cell during the second programming loop.

According to another aspect of the present disclosure, the third bitline voltage is a negative voltage.

According to yet another aspect of the present disclosure, the first memory cell is a first subset of memory cells being programmed to a first data state, and the second memory cell is a second subset of memory cells being programmed to a second data state that is at a higher voltage than the first data state. During the second programming loop, the control circuit is configured to apply the second bitline voltage to all bitlines coupled to the first subset of memory cells and to apply the third bitline voltage to all bitlines coupled to the second subset of memory cells.

According to still another aspect of the present disclosure, the control circuit is further configured to perform a third programming loop. In the third program loop, the control circuit simultaneously applies the second bitline voltage to all bitlines associated with the second subset of memory cells and applies the third bitline voltage to all bitlines coupled to a third subset of memory cells. The third subset of memory cells is being programmed to a third data state that is at a higher voltage than the second data state.

According to a further aspect of the present disclosure, the control circuit is further configured to, in the third programming loop, apply an inhibit bitline voltage to all bitlines coupled to the first subset of memory cells to inhibit programming of the first subset of memory cells during the third programming loop.

According to yet a further aspect of the present disclosure, the control circuit is further configured to, in the second programming loop, apply an inhibit bitline voltage to at least one bitline coupled to an additional memory cell to inhibit programming of the additional memory cell.

Another aspect of the present disclosure is related to a controller that is in communication with a memory apparatus that includes a plurality of memory cells. Each of the plurality of memory cells is connected to one of a plurality of word lines, is connected to one of a plurality of bit lines, is arranged in a plurality of blocks, and is configured to retain a threshold voltage corresponding to one of a plurality of data states. The controller is configured to perform a first programming loop and a second programming loop. In the first programming loop, the controller applies a first programming voltage to a control gate of a selected word line and applied a first bitline voltage to a bitline coupled with a first memory cell that is being programmed to a first data state and to a bitline coupled to a second memory cell that is being programmed to a second data state. In the second programming loop, the controller is configured to apply a second programming voltage to the control gate of the selected word line and to simultaneously apply a second bitline voltage to the bitline coupled to the first memory cell and apply a third bitline voltage to the bitline coupled to the second memory cell. The second bitline voltage is greater than the first bitline voltage to reduce a programming speed of the first memory cell, and the third bitline voltage is less than the first bitline voltage to increase a programming speed of the second memory cell.

According to another aspect of the present disclosure, the third bitline voltage is a negative voltage.

According to yet another aspect of the present disclosure, the first memory cell is in a first subset of memory cells that are being programmed to a first data state, and the second memory cell is in a second subset of memory cells that are being programmed to a second data state that is at a higher voltage than the first data state. The control circuit is configured to, during the second programming loop, apply the second bitline voltage to all bitlines coupled to the first subset of memory cells and apply the third bitline voltage to all bitlines coupled to the second subset of memory cells.

According to yet another aspect of the present disclosure, the controller is further configured to perform a third programming loop and, in the third programming loop, simultaneously apply the second bitline voltage to all bitlines associated with the second subset of memory cells and apply the third bitline voltage to all bitlines coupled to a third subset of memory cells. The third subset of memory cells are being programmed to a third data state that is at a higher voltage than the second data state.

According to still another aspect of the present disclosure, the controller is further configured to, in the third programming loop, apply an inhibit bitline voltage to all bitlines coupled to the first subset of memory cells to inhibit programming of the first subset of memory cells during the third programming loop.

According to a further aspect of the present disclosure, the controller is further configured to, in the second programming loop, apply an inhibit bitline voltage to at least one bitline coupled to an additional memory cell to inhibit programming of the additional memory cell.

BRIEF DESCRIPTION OF THE DRAWINGS

The drawings described herein are for illustrative purposes only of selected embodiments and not all possible implementations and are not intended to limit the scope of the present disclosure, wherein:

FIG. 10 illustrates the Vth distributions of the data states in a MLC memory system;

FIG. 11 illustrates the Vth distributions of the data states in a TLC memory system;

FIG. 12 illustrates the Vth distributions of the data states in a QLC memory system;

DETAILED DESCRIPTION

Figure 1A:
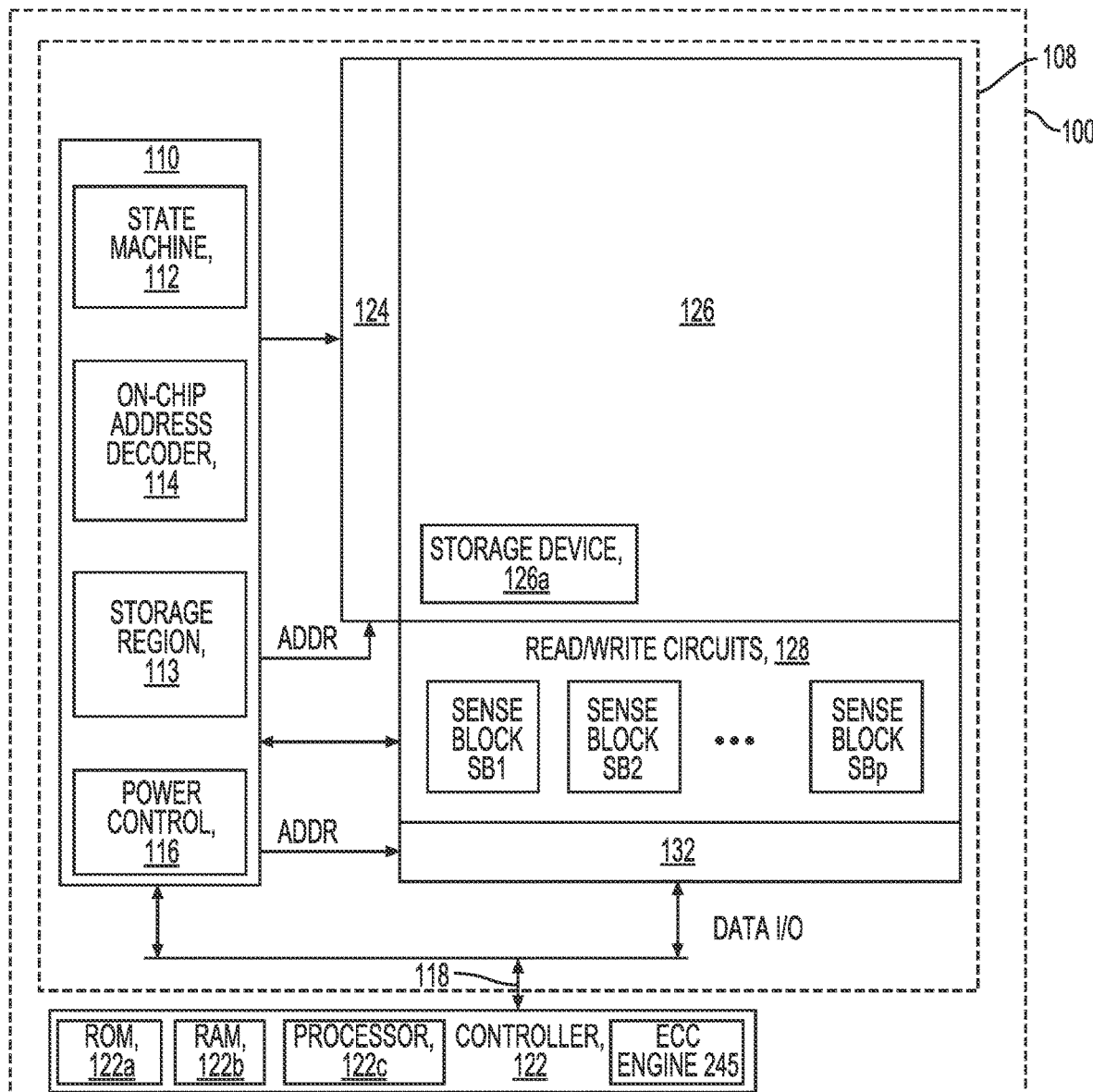
FIG. 1A illustrates a block diagram of an example memory device.

The following discussion is directed to various embodiments of the disclosure. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

A program and verify operation for a set of memory cells typically involves applying a series of progressively increasing program voltages to memory cells of a selected word line after the memory cells are provided in an erased data state. Each program voltage is provided in a program loop, also referred to as an loop of the program and verify operation. For example, the program voltage may be applied to a word line that is connected to control gates of the memory cells. In one approach, incremental step pulse programming is performed, where the program voltage is increased by a fixed step size (for example, dVpgm) in between program loops. Verify operations may be performed after each program voltage to determine whether the memory cells have completed programming. When programming is completed for a memory cell, it may be locked out (inhibited) from further programming while programming continues for other memory cells in subsequent program loops. The program and verify operation may be a multi-stage program and verify operation; a full sequence program and verify operation; a one-step program and verify operation; or another type of program and verify operation.

As discussed in further detail below, at certain stages of the program and verify operation, it may be desirable to slow the programming speed for certain memory cells while increasing the programming speed for other memory cells. The controller and methods as taught herein are configured to effectuate this operation.

Each memory cell may be associated with a data state according to write data in a program command. A memory cell may be in an erased data state (Er) or may be programmed to a programmed data state that is different from the erased data state Er. For example, in a two-bit per cell (MLC) memory device, there are four data states including the erased data state Er and three programmed data states referred to as the A, B and C data states (see FIG. 10). In a three-bit per cell (TLC) memory device, there are eight data states including the erased data state Er and seven programmed data states referred to as the A, B, C, D, E, F and G data states (see FIG. 11). In a four-bit per cell (QLC) memory device, there are sixteen data states including the erased data state Er and fifteen programmed data states referred to as the Er, A, B, C, D, E, F, G, H, I, J, K, L, M, N, and O (see FIG. 12), data states. These may also be referred to numerically, as data states 0, 1, 2, 3, 4, 5, 6, 7, 8, 9, 10, 11, 12, 13, 14, and 15, respectively. The following description is in reference to QLC but may be applicable to any multi-bit per memory cell configuration.

When a program command is issued, the write data is stored in latches associated with the memory cells. During programming, the latches of a memory cell may be read to determine the data state to which the cell is being programmed. Each programmed data state is associated with a verify voltage such that a memory cell with a given data state is considered to have completed programming when a read (sense) operation determines its threshold voltage (Vth) is above the associated verify voltage. A read (sense) operation may determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

Many known techniques or configurations for programming memory cells are unable to efficiently and/or effectively achieve fast programming without sacrificing reliability. Such techniques for programming often require more loops to complete programming (e.g., relative to the embodiments described herein), further increasing a total programming time and/or a total verify time as compared to the techniques presented herein Some embodiments described in further detail below include a control circuitry of a memory device that uses the verify operation to determine if any of the memory cells of the word line being programmed exceed a first threshold that is less than but near or equal to the Vth (such as for aforementioned A data state) of a first subset of memory cells. In response to this determination, during the next programming loop the controller simultaneously implements a quick pass write (QPW) operation to the first subset of memory cells to reduce the programming speed of the first subset of memory cells and simultaneously implements a reverse quick pass write (reverse QPW) operation to increase the programming speed of a second subset of memory cells being programmed to the higher states (such as aforementioned B-O data states). In this way, the control circuitry programs the set of memory cells of the selected word line at different speeds to effectuate slower, more accurate programming of the first subset of memory cells and faster programming of the second subset of memory cells. Furthermore, the control circuitry conserves resources (e.g., processing resources, memory resources, and/or the like) by reducing program and verify operation execution time relative to other known systems and methods (e.g., that require more voltage pulses to program, that has a higher total programming time, etc.). These performance advantages also are achieved without a sacrifice in programming reliability.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify loops; and in each program and verify loop, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify loop among the plurality of program and verify loops in which to perform a verify test for the another data state for the memory cells assigned to represent the another data state.

Figure 1B:
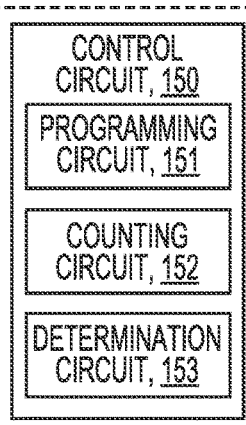
FIG. 1B illustrates a block diagram of an example control circuit which comprises a programming circuit, a counting circuit, and a determination circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software), and the programming operations described herein may be triggered by the host. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
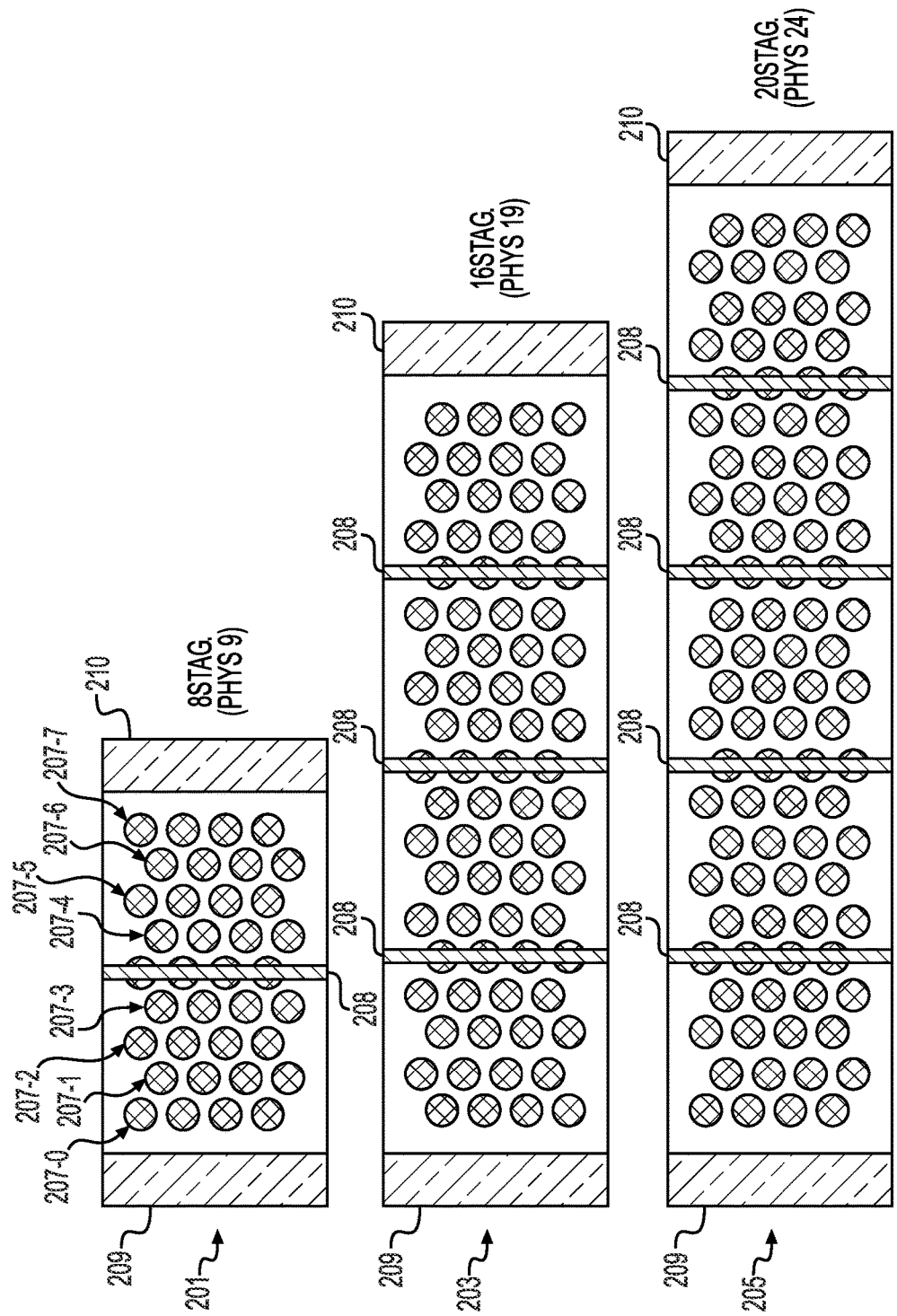
FIG. 2 illustrates a schematic view of three memory string architectures according to the principles of the present disclosure.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

With reference to memory architecture 201, the memory strings are shown in rows 207-0 through 207-7 in string architecture 201. A memory string may include a set of memory cells (e.g., which correspond to a set of memory holes). Each row is shown with four ends to the memory strings. A memory string may be connected to an adjacent string at an end (not visible beneath this view). A first group of rows 207-0 through 207-3 of shown on a left side of a dummy row 208. A second group of rows 207-4 through 207-7 of shown on a right side of the dummy row 208. The dummy row 208 separates the two groups of rows in the staggered eight row. A source line 209 is positioned at an edge of the first group and is remote from the dummy row 208. A source line 210 is positioned at an edge of the second group and is remote from the dummy row 208 and source line 209.

The memory architectures 203 and 205 may be similar to that of string architecture 201 except additional groups are added. String architecture 203 may be double the size of architecture 201 and may include sixteen rows of strings with each group of four rows separated by a dummy row. String architecture 205 may be larger than both the memory architecture 201 and the memory architecture 203. String architecture 205 may include twenty rows of strings with each group of four rows separated by a dummy row 208.

In some embodiments, memory architectures 201, 203, and/or 205 may include a chip under array structure. For example, memory architectures 201, 203, and/or 205 may include a chip under array structure whereby the control circuitry is under the memory array that includes the groups of memory strings. With the chip under array structure, the memory strings may include a direct strap contact for the source line for read and erase operations.

In the memory architecture 205, there may be five NAND string groups. In the example shown, each respective NAND string group may be separated by a dummy row 208. In this example, there are two outer-most NAND string groups, two inner NAND string groups (inner relative to an outer-most NAND string group), and an inner-most NAND string group.

In some embodiments, the memory architecture 205 may be a three-dimensional memory architecture that includes one or more three-dimensional blocks. In this case, a three-dimensional block may be logically segmented into multiple sub-blocks corresponding to NAND string groups. The three-dimensional block may also be segmented into multiple planes. Additional block description is provided further herein.

It is to be understood that the memory architectures shown in FIG. 2 are provided by way of example. In practice, the techniques described herein may be implemented on any number of different memory architectures, such as pipe-shaped BiCS (P-BiCS), a vertical recess array transistor (VRAT) architecture, and/or any other type of EEPROM or flash memory architecture.

Figure 3:
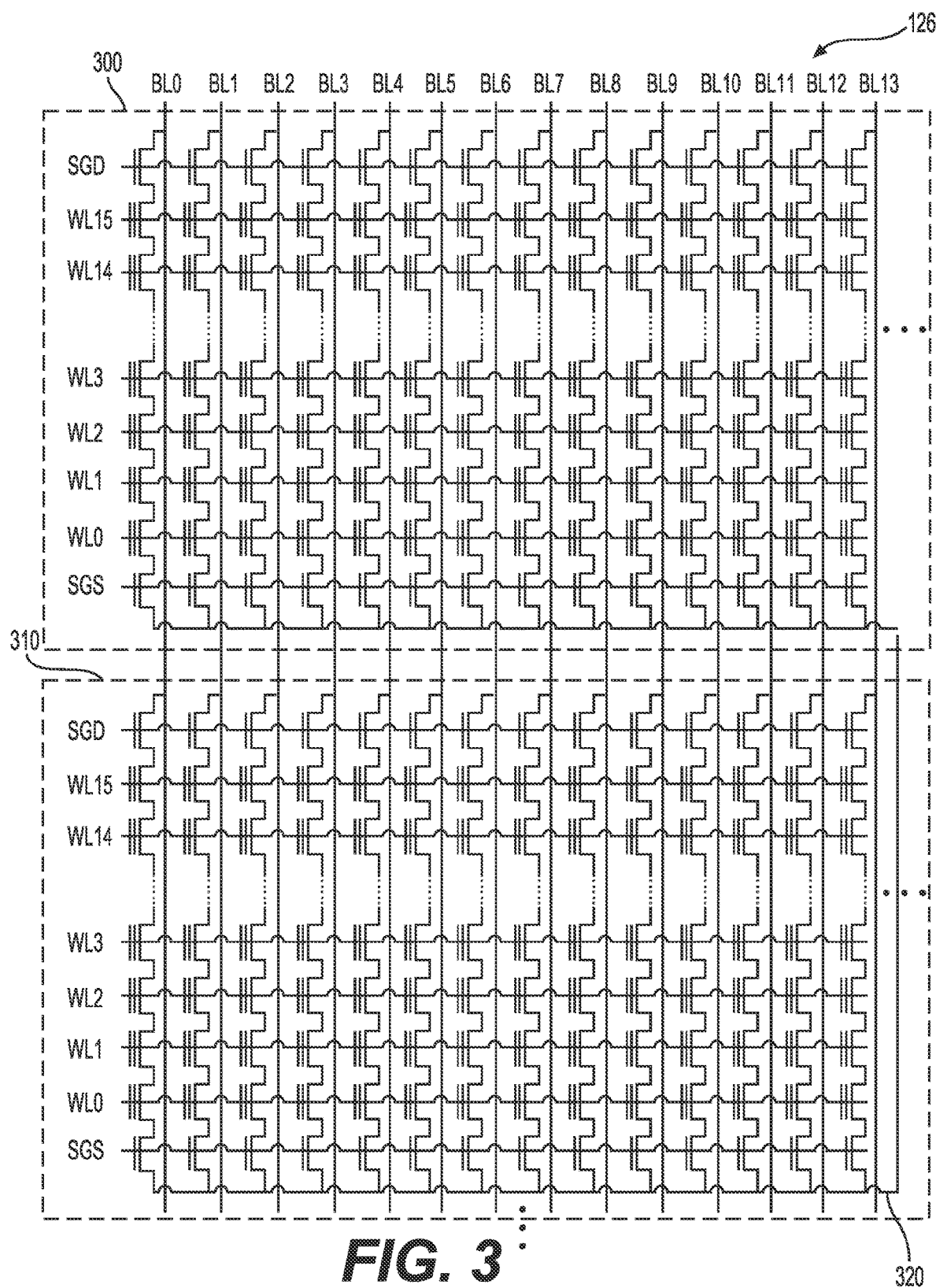
FIG. 3 depicts blocks of memory cells in an example two-dimensional configuration of the memory array of FIG. 1.

FIG. 3 illustrates blocks 300, 310 of memory cells in an example two-dimensional configuration of the memory array 126 of FIG. 1. The memory array 126 can include many such blocks 300, 310. Each example block 300, 310 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 320. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 4A:
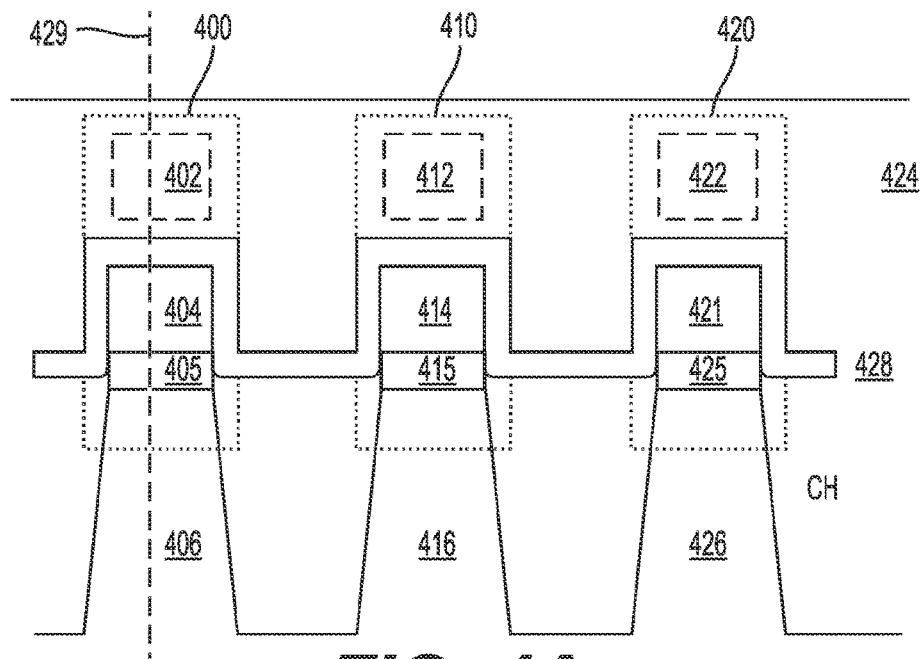
FIG. 4A illustrates a cross-sectional view of example floating gate memory cells in NAND strings.
Figure 4B:
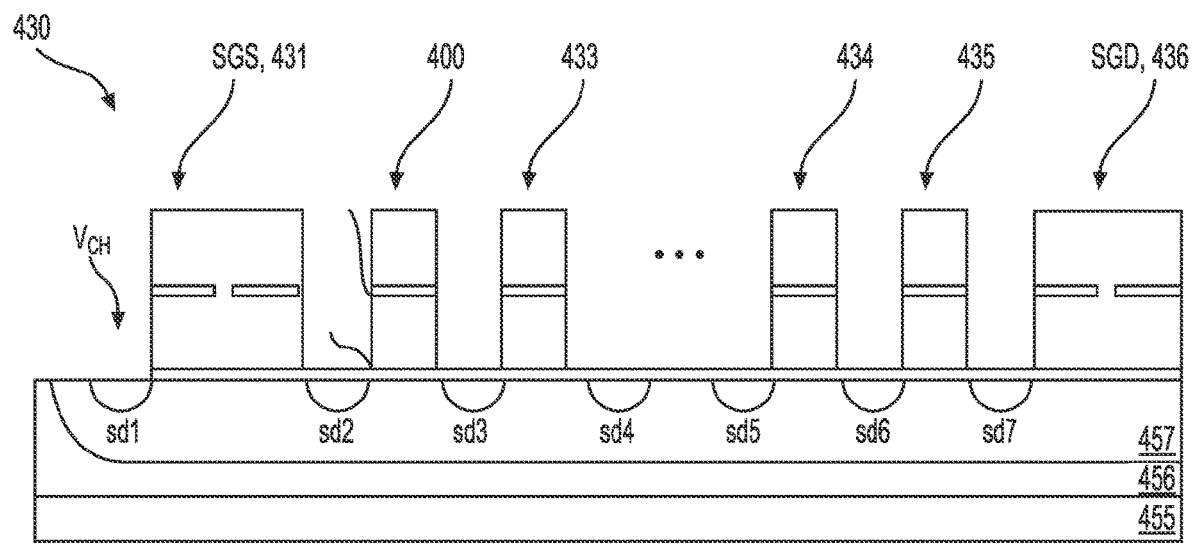
FIG. 4B illustrates a cross-sectional view of the structure of FIG. 4A along line 429.

One type of non-volatile memory which may be provided in the memory array is a floating gate memory, such as of the type shown in FIGS. 4A and 4B. However, other types of non-volatile memory can also be used. As discussed in further detail below, in another example shown in FIGS. 5A and 5B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 4A illustrates a cross-sectional view of example floating gate memory cells 400, 410, 420 in NAND strings. In this figure, a bit line or NAND string direction goes into the page, and a word line direction goes from left to right. As an example, word line 424 extends across NAND strings which include respective channel regions 406, 416 and 426. The memory cell 400 includes a control gate 402, a floating gate 404, a tunnel oxide layer 405 and the channel region 406. The memory cell 410 includes a control gate 412, a floating gate 414, a tunnel oxide layer 415 and the channel region 416. The memory cell 420 includes a control gate 422, a floating gate 421, a tunnel oxide layer 425 and the channel region 426. Each memory cell 400, 410, 420 is in a different respective NAND string. An inter-poly dielectric (IPD) layer 428 is also illustrated. The control gates 402, 412, 422 are portions of the word line. A cross-sectional view along contact line connector 429 is provided in FIG. 4B.

The control gate 402, 412, 422 wraps around the floating gate 404, 414, 421, increasing the surface contact area between the control gate 402, 412, 422 and floating gate 404, 414, 421. This results in higher IPD capacitance, leading to a higher coupling ratio which makes programming and erase easier. However, as NAND memory devices are scaled down, the spacing between neighboring cells 400, 410, 420 becomes smaller so there is almost no space for the control gate 402, 412, 422 and the IPD layer 428 between two adjacent floating gates 402, 412, 422.

Figure 5A:
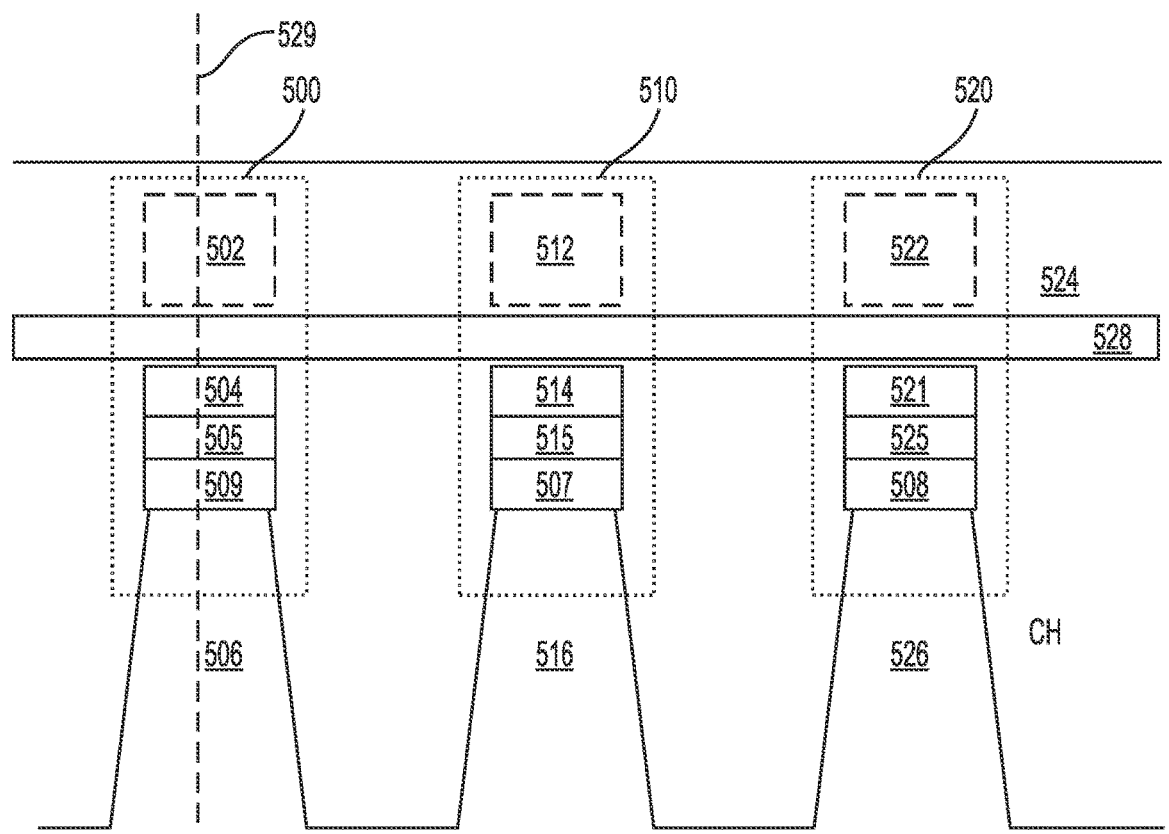
FIG. 5A illustrates a cross-sectional view of another example type of charge-trapping memory cells in NAND strings.
Figure 5B:
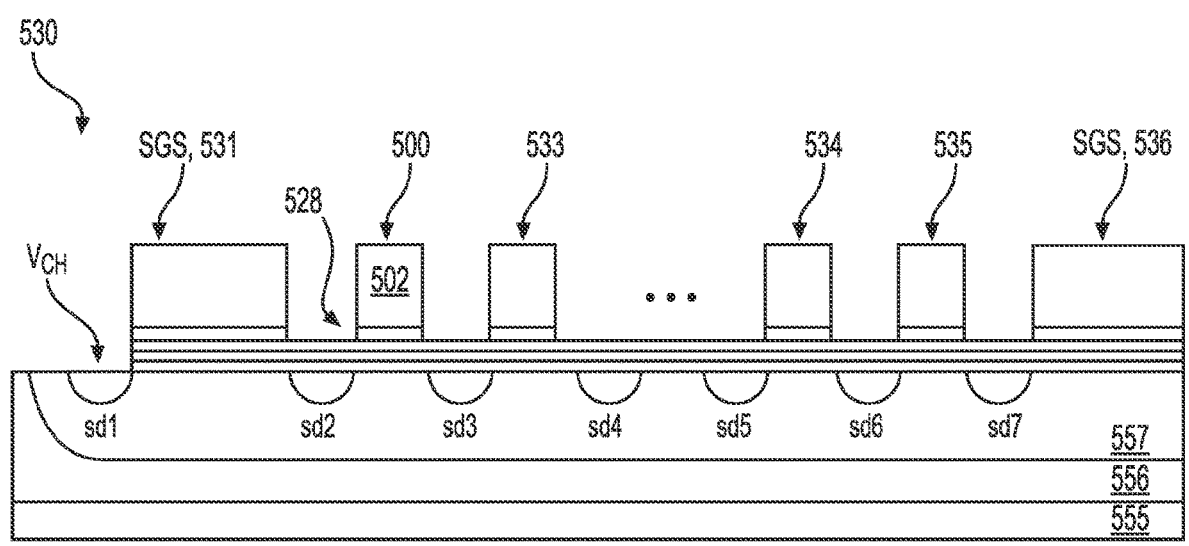
FIG. 5B illustrates a cross-sectional view of the structure of FIG. 5A along line 529.

As an alternative, as shown in FIGS. 5A and 5B, the flat or planar memory cell 500, 510, 520 has been developed in which the control gate 502, 512, 522 is flat or planar; that is, it does not wrap around the floating gate and its only contact with the charge storage layer 528 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 5A depicts a cross-sectional view of example charge-trapping memory cells 500, 510, 520 in NAND strings. The view is in a word line direction of memory cells 500, 510, 520 comprising a flat control gate and charge-trapping regions as a two-dimensional example of memory cells 500, 510, 520 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 524 extends across NAND strings which include respective channel regions 506, 516, 526. Portions of the word line provide control gates 502, 512, 522. Below the word line is an IPD layer 528, charge-trapping layers 504, 514, 521, polysilicon layers 505, 515, 525, and tunneling layers 509, 507, 508. Each charge-trapping layer 504, 514, 521 extends continuously in a respective NAND string. The flat configuration of the control gate can be made thinner than a floating gate. Additionally, the memory cells can be placed closer together.

FIG. 5B illustrates a cross-sectional view of the structure of FIG. 5A along contact line connector 529. The NAND string 530 includes an SGS transistor 531, example memory cells 500, 533, . . . 535, and an SGD transistor 536. Passageways in the IPD layer 528 in the SGS and SGD transistors 531, 536 allow the control gate layers 502 and floating gate layers to communicate. The control gate 502 and floating gate layers may be polysilicon and the tunnel oxide layer may be silicon oxide, for instance. The IPD layer 528 can be a stack of nitrides (N) and oxides (O) such as in a N—O—N—O—N configuration.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well. A channel voltage, Vch, may be applied directly to the channel region of the substrate.

Figure 6A:
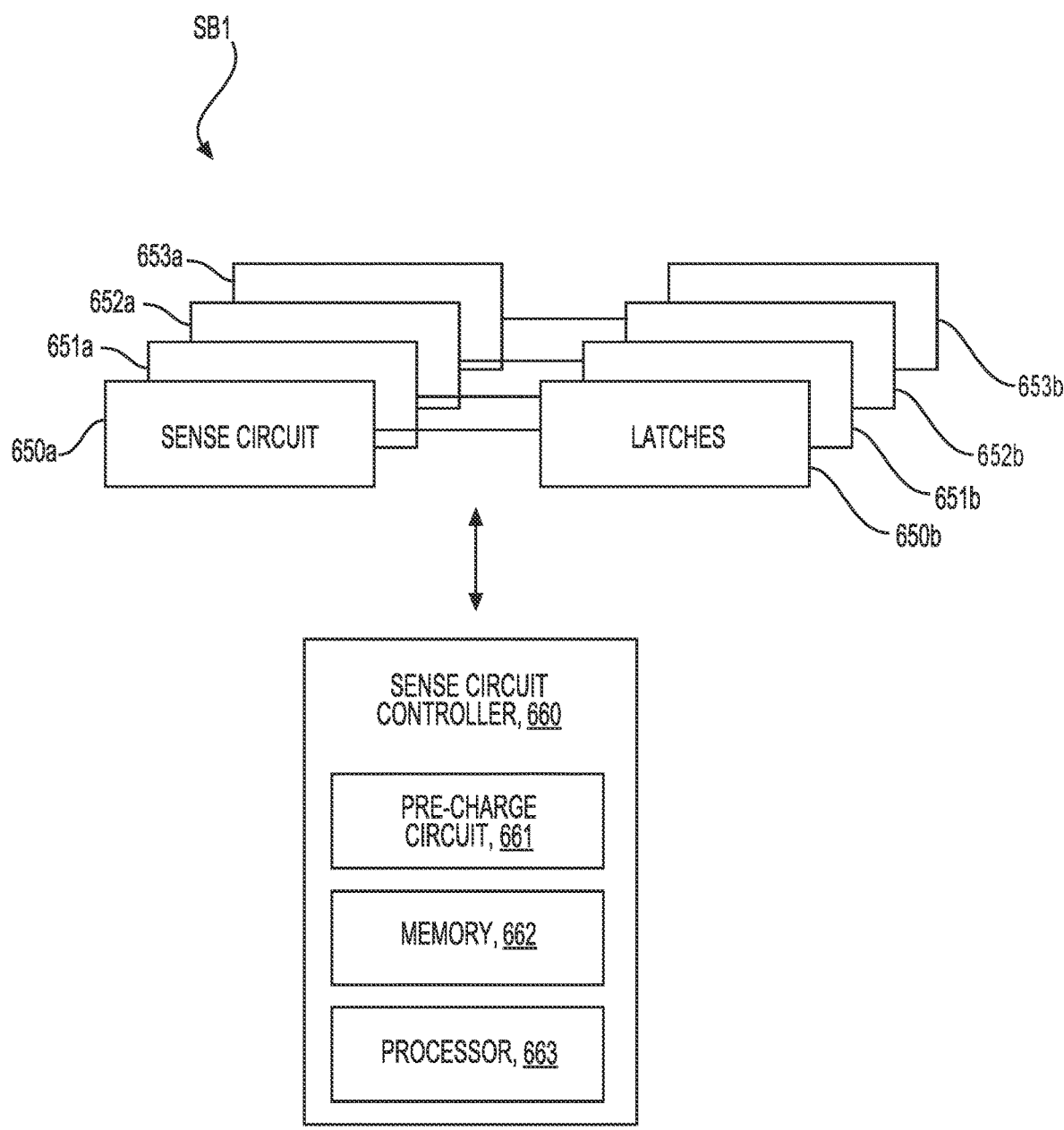
FIG. 6A illustrates an example block diagram of the sense block SB1 of FIG. 1.

FIG. 6A illustrates an example block diagram of the sense block SB1 of FIG. 1. In one approach, a sense block comprises multiple sense circuits. Each sense circuit is associated with data latches. For example, the example sense circuits 650a, 651a, 652a and 653a are associated with the data latches 650b, 651b, 652b and 653b, respectively. In one approach, different subsets of bit lines can be sensed using different respective sense blocks. This allows the processing load which is associated with the sense circuits to be divided up and handled by a respective processor in each sense block. For example, a sense circuit controller 660 in SB1 can communicate with the set of sense circuits and latches. The sense circuit controller 660 may include a pre-charge circuit 661 which provides a voltage to each sense circuit for setting a pre-charge voltage. In one possible approach, the voltage is provided to each sense circuit independently, e.g., via the data bus 603 and a local bus such as LBUS1 or LBUS2 in FIG. 6B. In another possible approach, a common voltage is provided to each sense circuit concurrently, e.g., via the contact line 605 in FIG. 6B. The sense circuit controller 660 may also include a memory 662 and a processor 663. The memory 662 may store code which is executable by the processor to perform the functions described herein. These functions can include reading the latches 650b, 651b, 652b, 653b which are associated with the sense circuits 650a, 651a, 652a, 653a, setting bit values in the latches and providing voltages for setting pre-charge levels in sense nodes of the sense circuits 650a, 651a, 652a, 653a. Further example details of the sense circuit controller 660 and the sense circuits 650a and 651a are provided below.

Figure 6B:
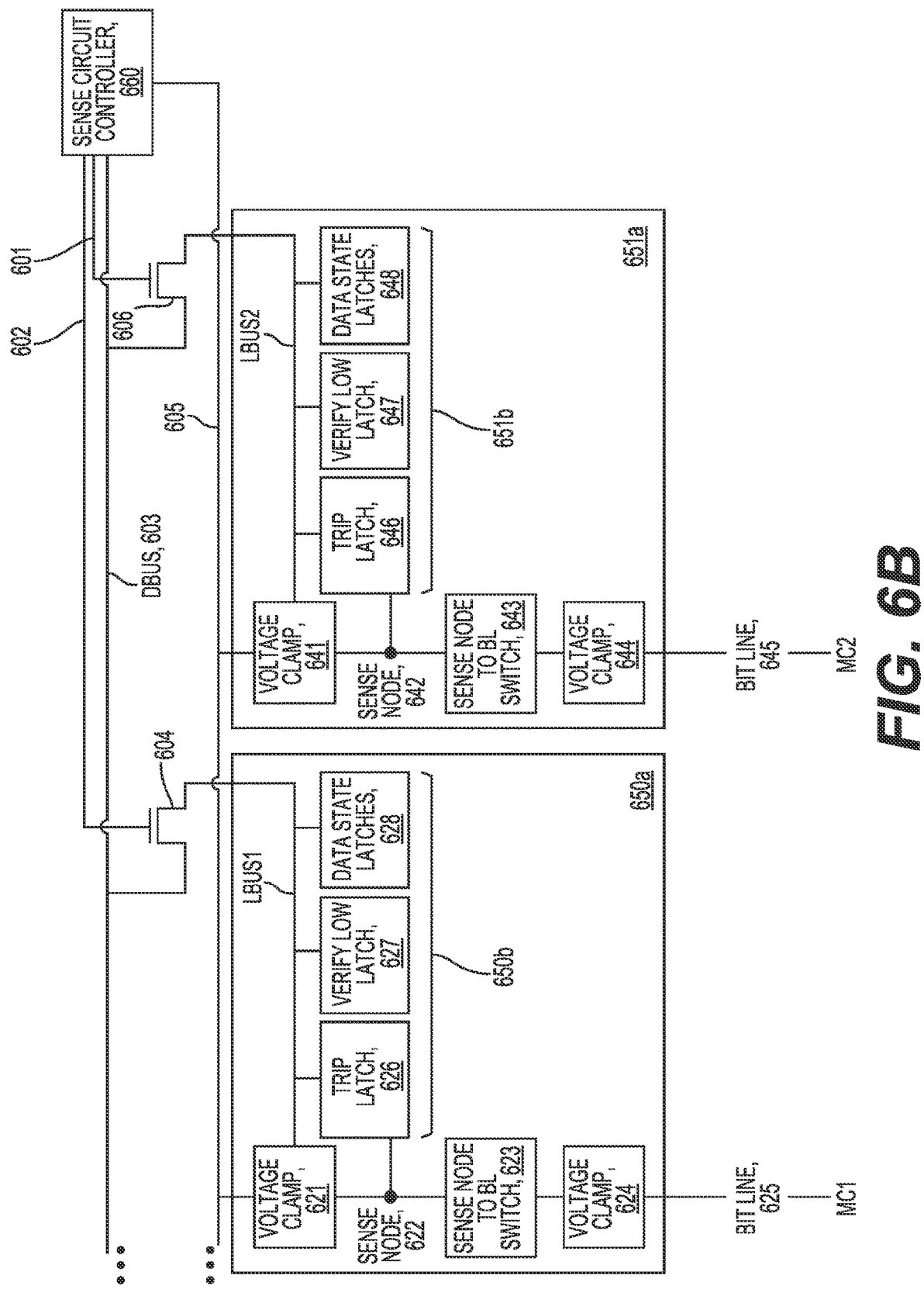
FIG. 6B illustrates another example block diagram of the sense block SB1 of FIG. 1.

With reference to FIG. 6B, the sense circuit controller 660 can communicate with different sense circuits 650a, 651a in a time-multiplexed manner, for instance. A contact line 605 may be connected to the voltage clamp 621, 641 in each sense circuit 650a, 651a, in one approach.

Each sense circuit 650a, 651a includes latches 650b, 651b, including a trip latch 626, 646, an offset verify latch 627, 647 and data state latches 628, 648. A voltage clamp 621, 641 may be used to set a pre-charge voltage at a sense node 622, 642. A sense node to bit line (BL) switch 623, 643 selectively allows the sense node 622, 642 to communicate with a bit line 625, 645, and a voltage clamp 624, 644 can set a voltage on the bit line 625, 645, such as during a sensing operation or a programming operation. The bit line 625, 645 is connected to one or more memory cells such as memory cells MC1 and MC2. A local bus, LBUS1, LBUS2, allows the sense circuit controller 660 to communicate with components in the sense circuit 650a, 651a, such as the latches 650b, 651b and the voltage clamp 621, 641 in some cases. To communicate with the sense circuit 650a, 651a, the sense circuit controller 660 provides a voltage via a contact line 601, 602 to a transistor 604, 606 to connect LBUS1, LBUS2 with DBUS 603. The communicating can include sending data to the sense circuit 650a, 651a and/or receive data from the sense circuit 650a, 651a.

The sense circuit 650a may be a first sense circuit which comprises a first trip latch 626, and the sense circuit 651a may be a second sense circuit which comprises a second trip latch 646. The sense circuit 650a is an example of a first sense circuit comprising a first sense node 622, where the first sense circuit is associated with a first memory cell MC1 and a first bit line 625. The sense circuit 651a is an example of a second sense circuit comprising a second sense node 642, where the second sense circuit is associated with a second memory cell MC2 and a second bit line 645.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 7A:
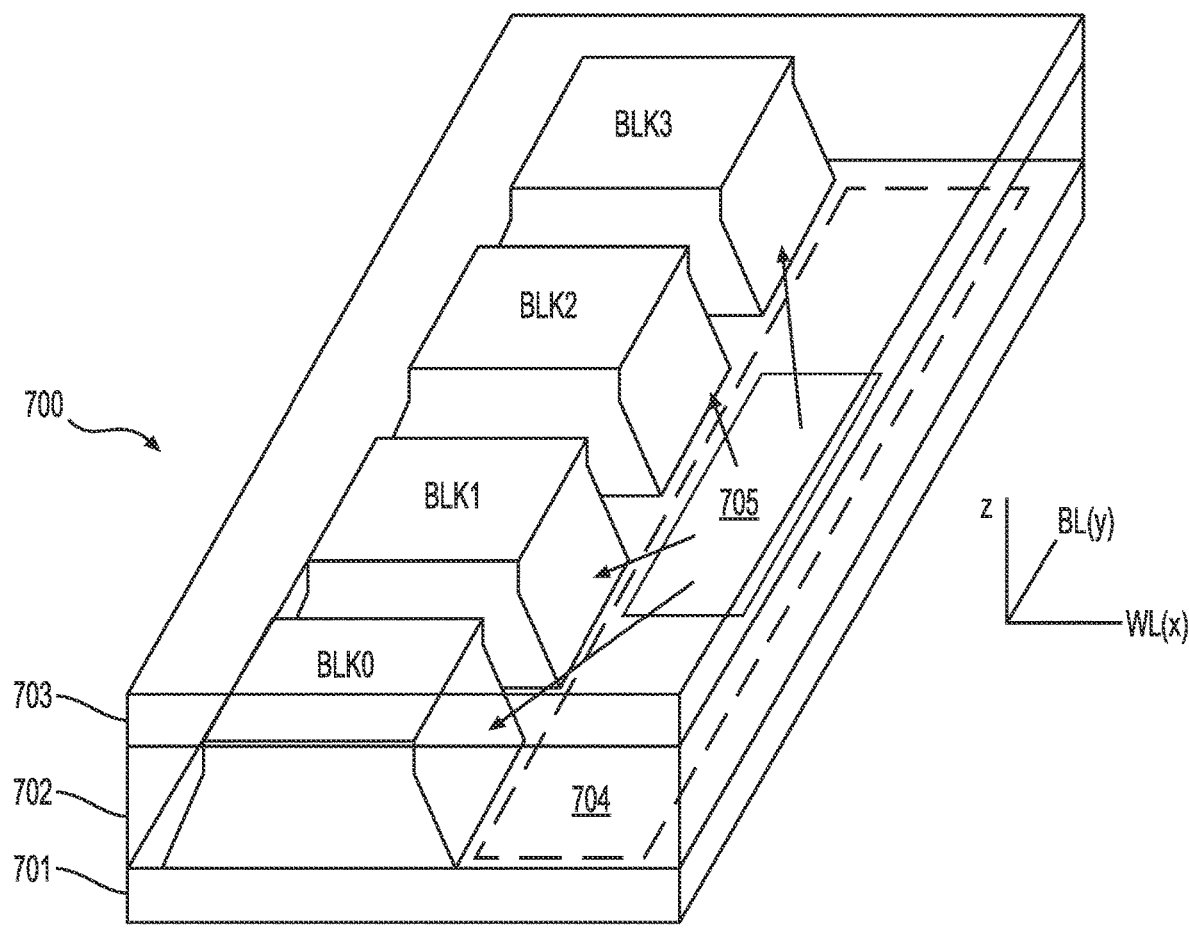
FIG. 7A illustrates a perspective view of a set of blocks in an example three-dimensional configuration of the memory array of FIG. 1.

FIG. 7A is a perspective view of a set of blocks 700 in an example three-dimensional configuration of the memory array 126 of FIG. 1. On the substrate are example blocks BLK0, BLK1, BLK2, BLK3 of memory cells (storage elements) and a peripheral area 704 with circuitry for use by the blocks BLK0, BLK1, BLK2, BLK3. For example, the circuitry can include voltage drivers 705 which can be connected to control gate layers of the blocks BLK0, BLK1, BLK2, BLK3. In one approach, control gate layers at a common height in the blocks BLK0, BLK1, BLK2, BLK3 are commonly driven. The substrate 701 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 702 of the memory device. In an upper region 703 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 7B:
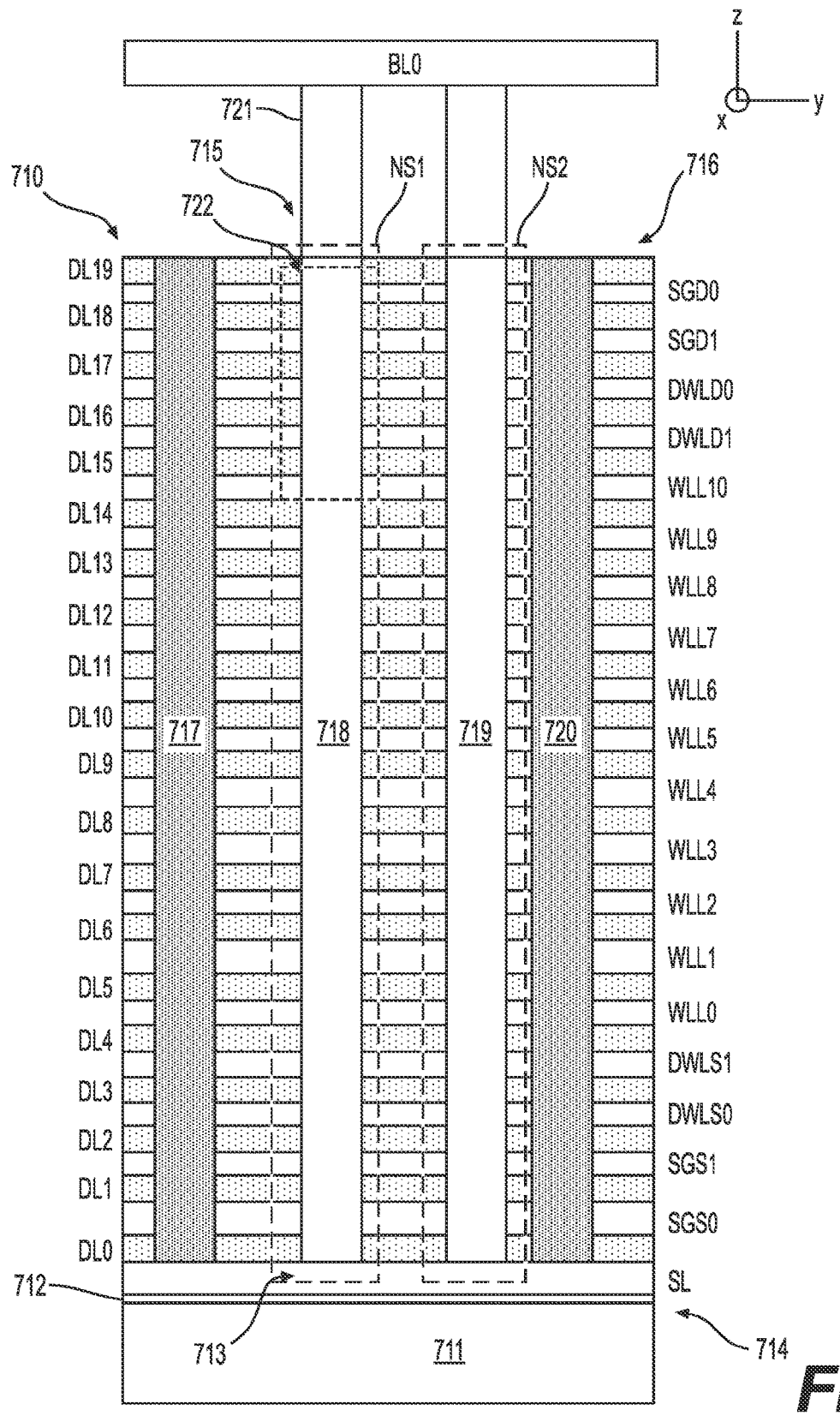
FIG. 7B illustrates an example cross-sectional view of a portion of one of the blocks of FIG. 7A.

FIG. 7B illustrates an example cross-sectional view of a portion of one of the blocks BLK0, BLK1, BLK2, BLK3 of FIG. 7A. The block comprises a stack 710 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 710 which comprise NAND strings NS1 and NS2 are illustrated. Each NAND string encompasses a memory hole 718, 719 which is filled with materials which form memory cells adjacent to the word lines. A region 722 of the stack 710 is shown in greater detail in FIG. 7D and is discussed in further detail below.

The 710 stack includes a substrate 711, an insulating film 712 on the substrate 711, and a portion of a source line SL. NS1 has a source-end 713 at a bottom 714 of the stack and a drain-end 715 at a top 716 of the stack 710. Contact line connectors (e.g., slits, such as metal-filled slits) 717, 720 may be provided periodically across the stack 710 as interconnects which extend through the stack 710, such as to connect the source line to a particular contact line above the stack 710. The contact line connectors 717, 720 may be used during the formation of the word lines and subsequently filled with metal. A portion of a bit line BL0 is also illustrated. A conductive via 721 connects the drain-end 715 to BL0.

Figure 7C:
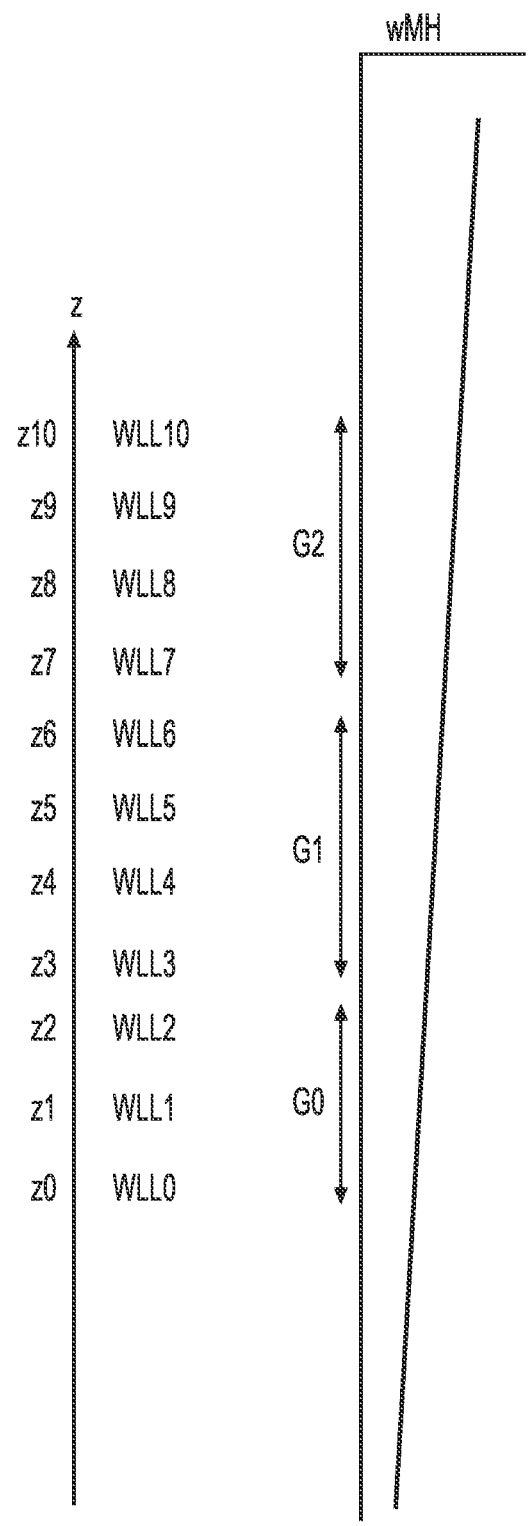
FIG. 7C illustrates a plot of memory hole diameter in the stack of FIG. 7B.

FIG. 7C illustrates a plot of memory hole diameter in the stack of FIG. 7B. The vertical axis is aligned with the stack of FIG. 7B and illustrates a width (wMH), e.g., diameter, of the memory holes 718 and 719. The word line layers WLL0-WLL10 of FIG. 7A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 7D:
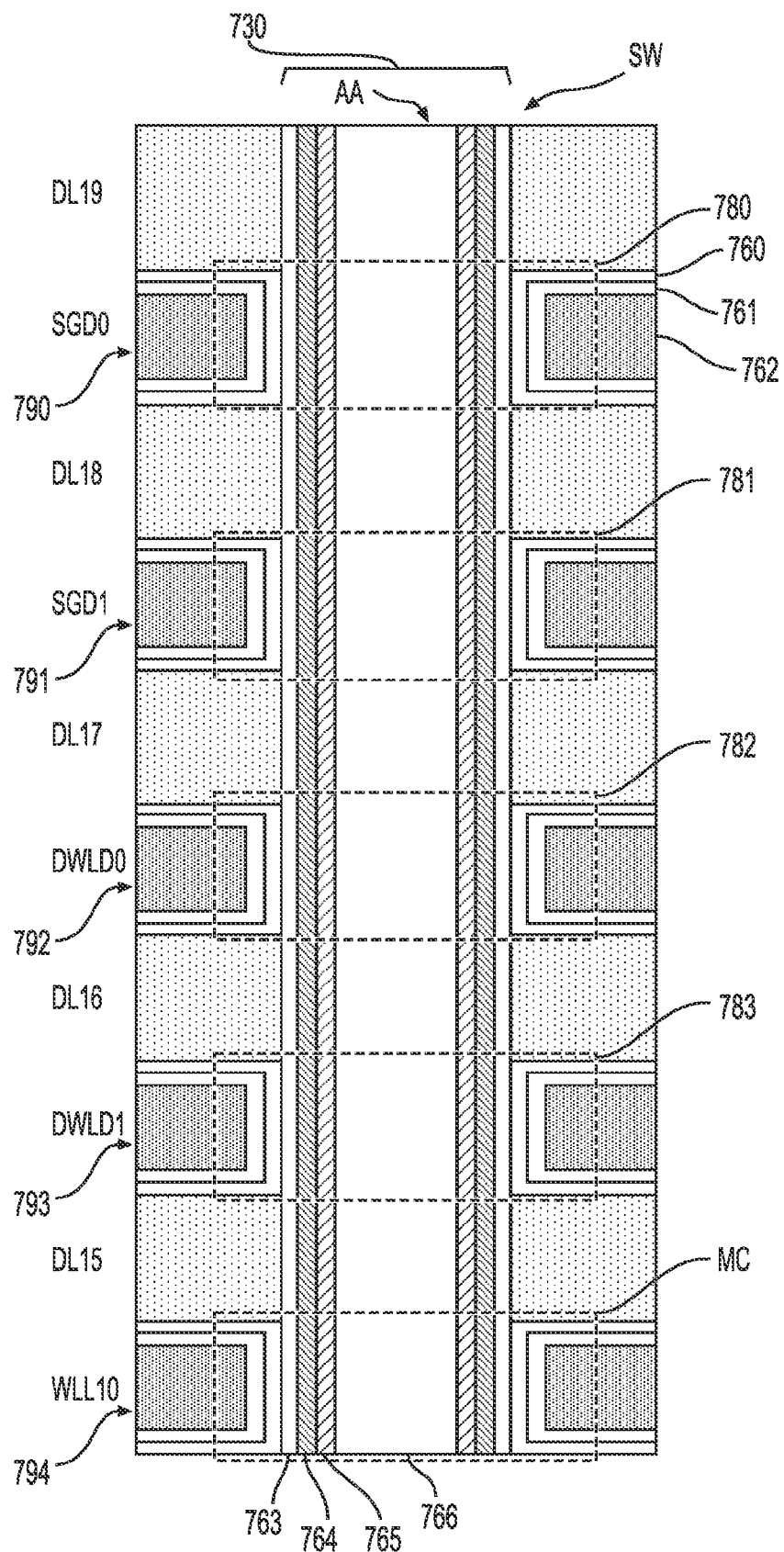
FIG. 7D illustrates a close-up view of the region 622 of the stack of FIG. 7B.

FIG. 7D illustrates a close-up view of the region 722 of the stack 710 of FIG. 7B. Memory cells are formed at the different levels of the stack at the intersection of a word line layer and a memory hole. In this example, SGD transistors 780, 781 are provided above dummy memory cells 782, 783 and a data memory cell MC. A number of layers can be deposited along the sidewall (SW) of the memory hole 730 and/or within each word line layer, e.g., using atomic layer deposition. For example, each column (e.g., the pillar which is formed by the materials within a memory hole 730) can include a charge-trapping layer or film 763 such as SiN or other nitride, a tunneling layer 764, a polysilicon body or channel 765, and a dielectric core 766. A word line layer can include a blocking oxide/block high-k material 760, a metal barrier 761, and a conductive metal 762 such as Tungsten as a control gate. For example, control gates 790, 791, 792, 793 and 794 are provided. In this example, all of the layers except the metal are provided in the memory hole 730. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 730 can be filled with a plurality of annular layers comprising a blocking oxide layer, a charge trapping layer 763, a tunneling layer 764 and a channel layer. A core region of each of the memory holes 730 is filled with a body material, and the plurality of annular layers are between the core region and the word line in each of the memory holes 730.

The NAND string can be considered to have a floating body channel because the length of the channel is not formed on a substrate. Further, the NAND string is provided by a plurality of word line layers above one another in a stack, and separated from one another by dielectric layers.

Figure 8A:
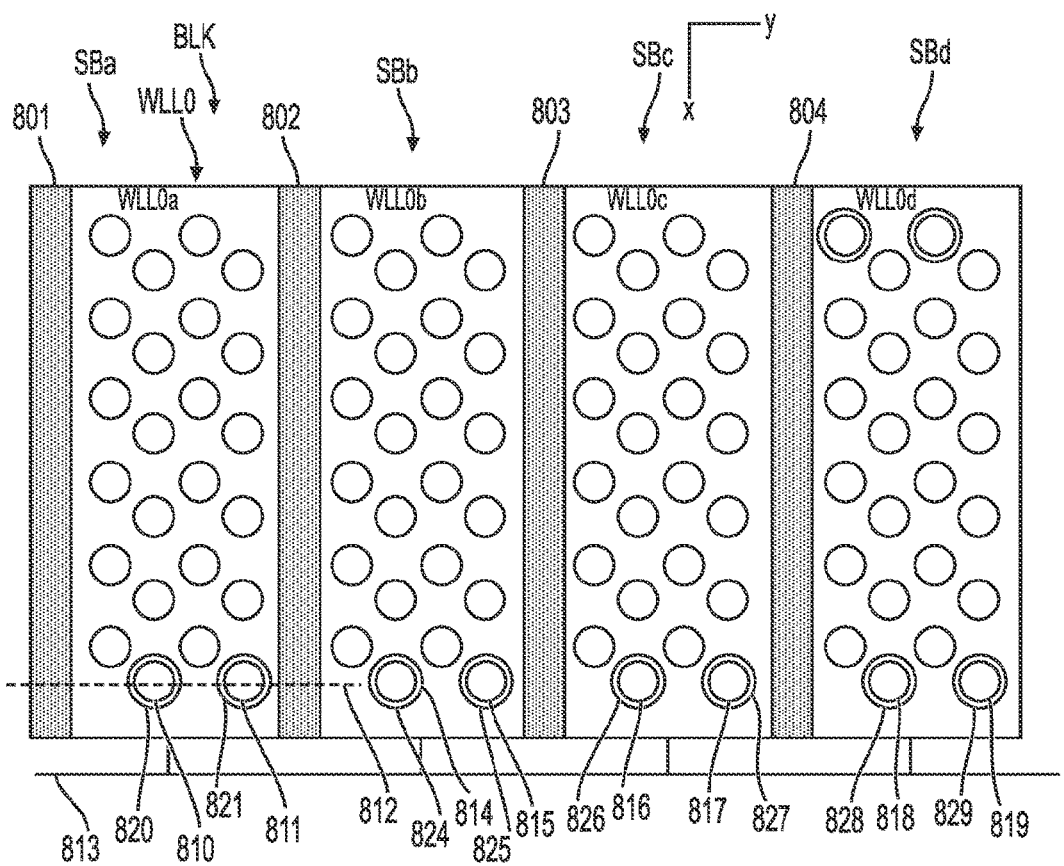
FIG. 8A illustrates a top view of an example word line layer WLL0 of the stack of FIG. 6B.

FIG. 8A illustrates a top view of an example word line layer WLL0 of the stack 710 of FIG. 7B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 8B:
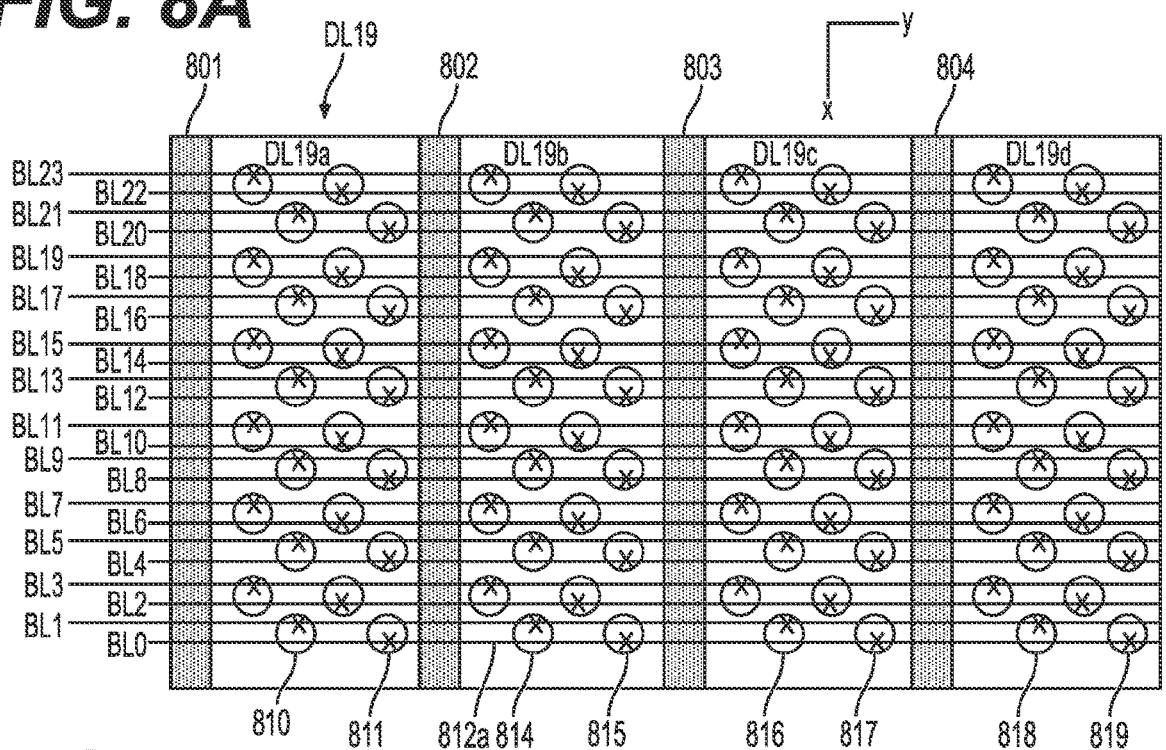
FIG. 8B illustrates a top view of an example top dielectric layer DL19 of the stack of FIG. 7B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WLL0 a, WLL0 b, WLL0 c and WLL0 d which are each connected by a contact line 813. The last region of a word line layer in a block can be connected to a first region of a word line layer in a next block, in one approach. The contact line 813, in turn, is connected to a voltage driver for the word line layer. The region WLL0a has example memory holes 810. 811 along a contact line 812. The region WLL0b has example memory holes 814, 815. The region WLL0c has example memory holes 816, 817. The region WLL0d has example memory holes 818, 819. The memory holes are also shown in FIG. 8B. Each memory hole can be part of a respective NAND string. For example, the memory holes 810, 814, 816 and 818 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 820, 821 are in WLL0a, memory cells 824, 825 are in WLL0b, memory cells 826, 827 are in WLL0c, and memory cells 828, 829 are in WLL0d. These memory cells are at a common height in the stack.

Contact line connectors (e.g., slits, such as metal-filled slits) 801, 802, 803, 804 may be located between and adjacent to the edges of the regions WLL0a-WLL0d. The contact line connectors 801, 802, 803, 804 provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 9A for further details of the sub-blocks SBa-SBd of FIG. 8A.

FIG. 8B illustrates a top view of an example top dielectric layer DL19 of the stack of FIG. 7B. The dielectric layer is divided into regions DL19a, DL19b, DL19c and DL19d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL19a has the example memory holes 810, 811 along a contact line 812a, which is coincident with a bit line BL0. A number of bit lines extend above the memory holes and are connected to the memory holes as indicated by the "X" symbols. BL0 is connected to a set of memory holes which includes the memory holes 811, 815, 817, 819. Another example bit line BL1 is connected to a set of memory holes which includes the memory holes 810, 814, 816, 818. The contact line connectors (e.g., slits, such as metal-filled slits) 801, 802, 803, 804 from FIG. 8A are also illustrated, as they extend vertically through the stack. The bit lines can be numbered in a sequence BL0-BL23 across the DL19 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

Figure 9A:
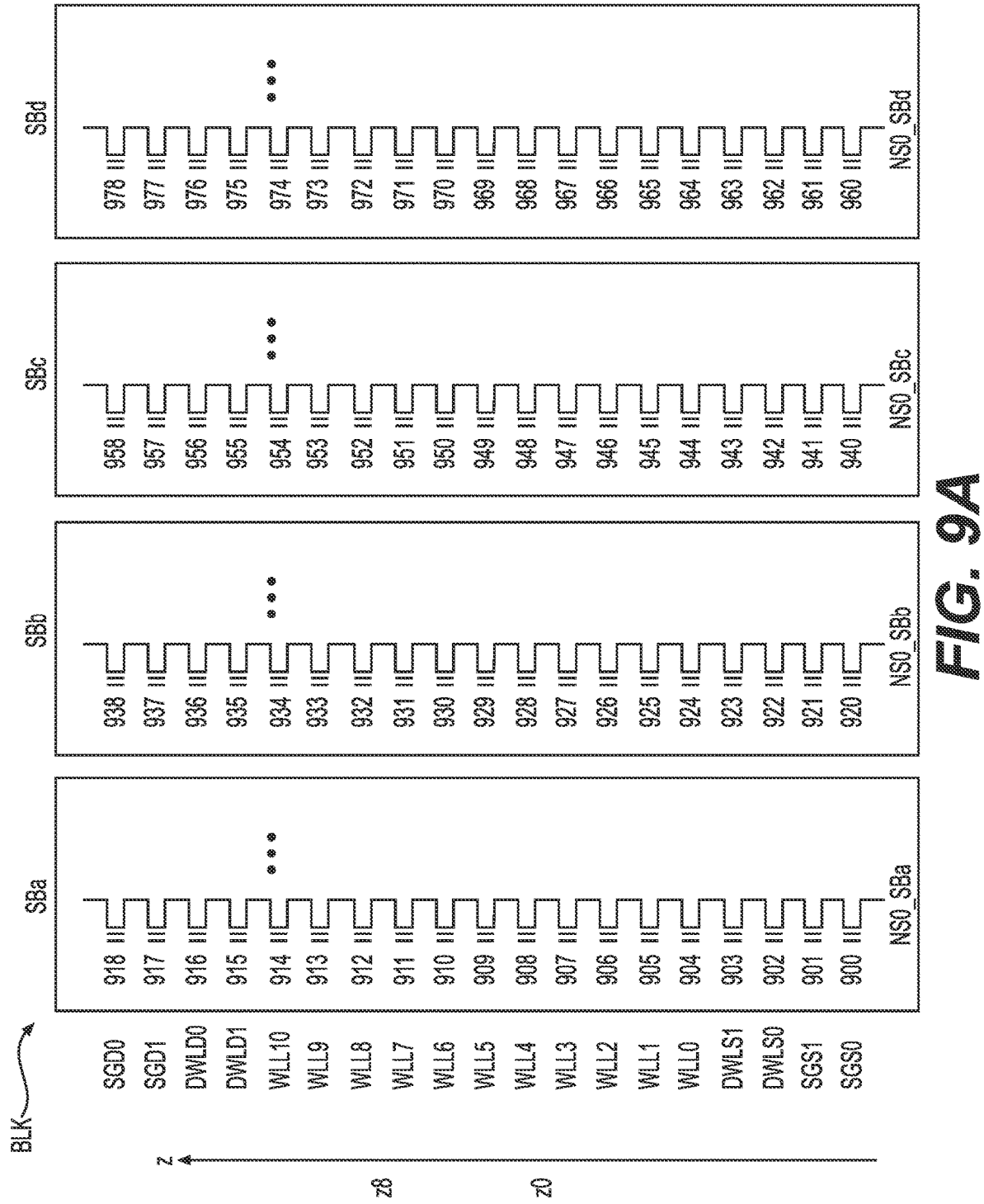
FIG. 9A illustrates example NAND strings in the sub-blocks SBa-SBd of FIG. 8A.

FIG. 9A illustrates example NAND strings in the sub-blocks SBa-SBe of FIG. 8A. The sub-blocks are consistent with the structure of FIG. 7B. The conductive layers in the stack are illustrated for reference at the left hand side. Each sub-block includes multiple NAND strings, where one example NAND string is illustrated. For example, SBa comprises an example NAND string NS0, SBb comprises an example NAND string NS1, SBc comprises an example NAND string NS2, SBd comprises an example NAND string NS3, and SBe comprises an example NAND string NS4.

Additionally, NS0_SBa include SGS transistors 900 and 901, dummy memory cells 902 and 903, data memory cells 904, 905, 906, 907, 908, 909, 910, 911, 912, 913 and 914, dummy memory cells 915 and 916, and SGD transistors 917 and 918.

NS1_SBb include SGS transistors 920 and 921, dummy memory cells 922 and 923, data memory cells 924, 925, 926, 927, 928, 929, 930, 931, 932, 933 and 934, dummy memory cells 935 and 936, and SGD transistors 937 and 938.

NS2_SBc include SGS transistors 940 and 941, dummy memory cells 942 and 843, data memory cells 944, 945, 946, 947, 948, 949, 950, 951, 952, 953 and 954, dummy memory cells 955 and 956, and SGD transistors 957 and 958.

NS3_SBd include SGS transistors 960 and 961, dummy memory cells 962 and 963, data memory cells 964, 965, 966, 967, 968, 969, 970, 971, 972, 973 and 974, dummy memory cells 975 and 976, and SGD transistors 977 and 978.

NS4_SBe include SGS transistors 980 and 981, dummy memory cells 982 and 983, data memory cells 984, 985, 986, 987, 988, 989, 980, 981, 982, 983 and 984, dummy memory cells 985 and 986, and SGD transistors 987 and 988.

At a given height in the block, memory cells in each sub-block are at a common height. For example, one set of memory cells (including the memory cell 904) is among a plurality of memory cells formed along tapered memory holes in a stack of alternating conductive and dielectric layers. The one set of memory cells is at a particular height z0 in the stack. Another set of memory cells (including the memory cell 924) connected to the one word line (WLL0) are also at the particular height. In another approach, another set of memory cells (e.g., including the memory cell 912) connected to another word line (e.g., WLL8) are at another height (z8) in the stack.

Figure 9B:
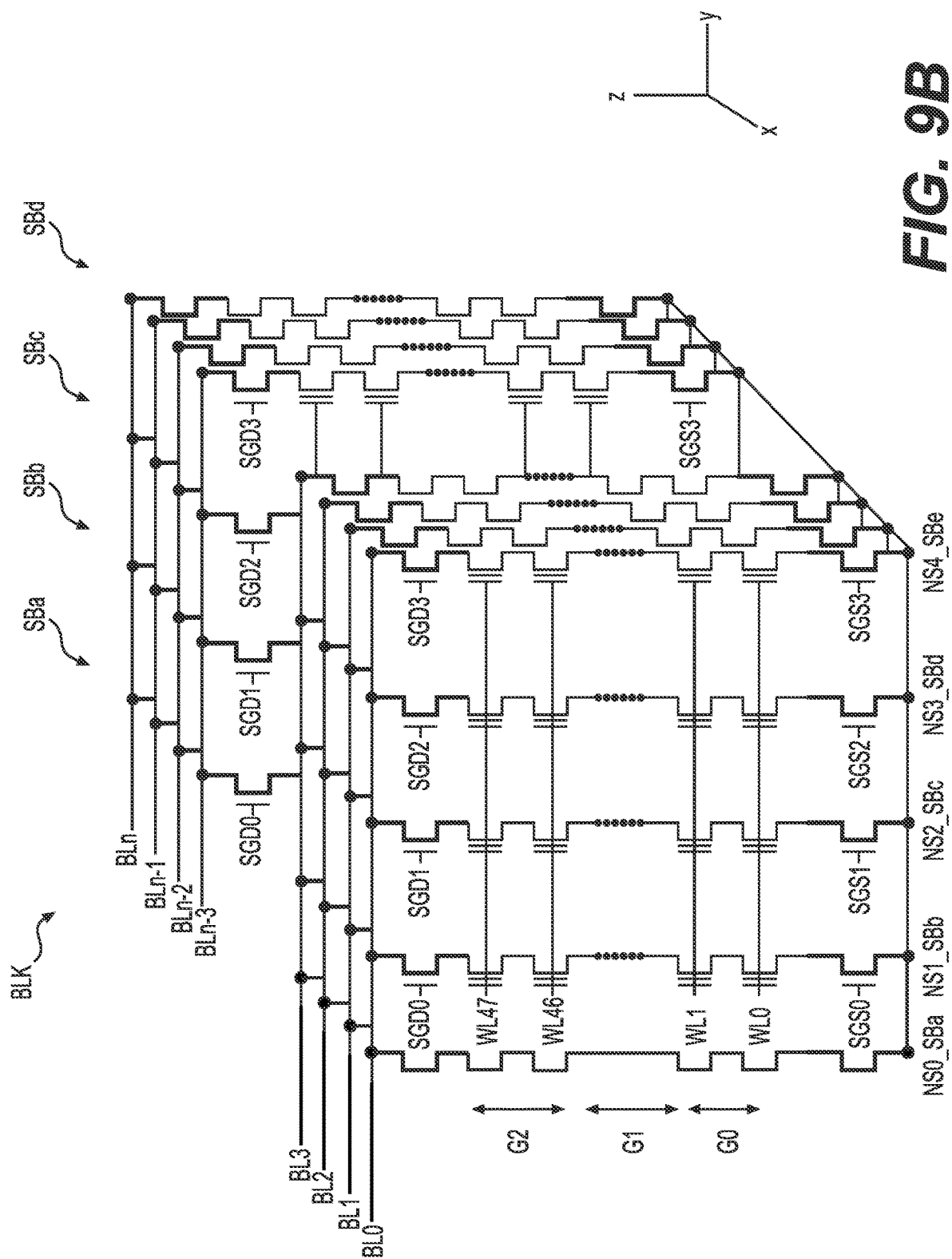
FIG. 9B illustrates another example view of NAND strings in sub-blocks.

FIG. 9B illustrates another example view of NAND strings in sub-blocks. The NAND strings include NS0_SBa, NS1_SBb, NS2_SBc, NS3_SBd, and NS4_SBe which have 48 word lines (e.g., WL0-WL47). Each sub-block comprises NAND string groups which extend in the x direction and which have a common SGD line, e.g., SGD0, SGD1, SGD2, SGD3, or SGD4. In this simplified example, there is only one SGD transistor and one SGS transistor in each NAND string. The NAND strings NS0_SBa, NS1_SBb, NS2_SBc, NS3_SBd, and NS4_SBe are in sub-blocks SBa, SBb, SBc, SBd, and SBe, respectively. Further, example, groups of word lines G0, G1 and G2 are illustrated.

Figure 13:
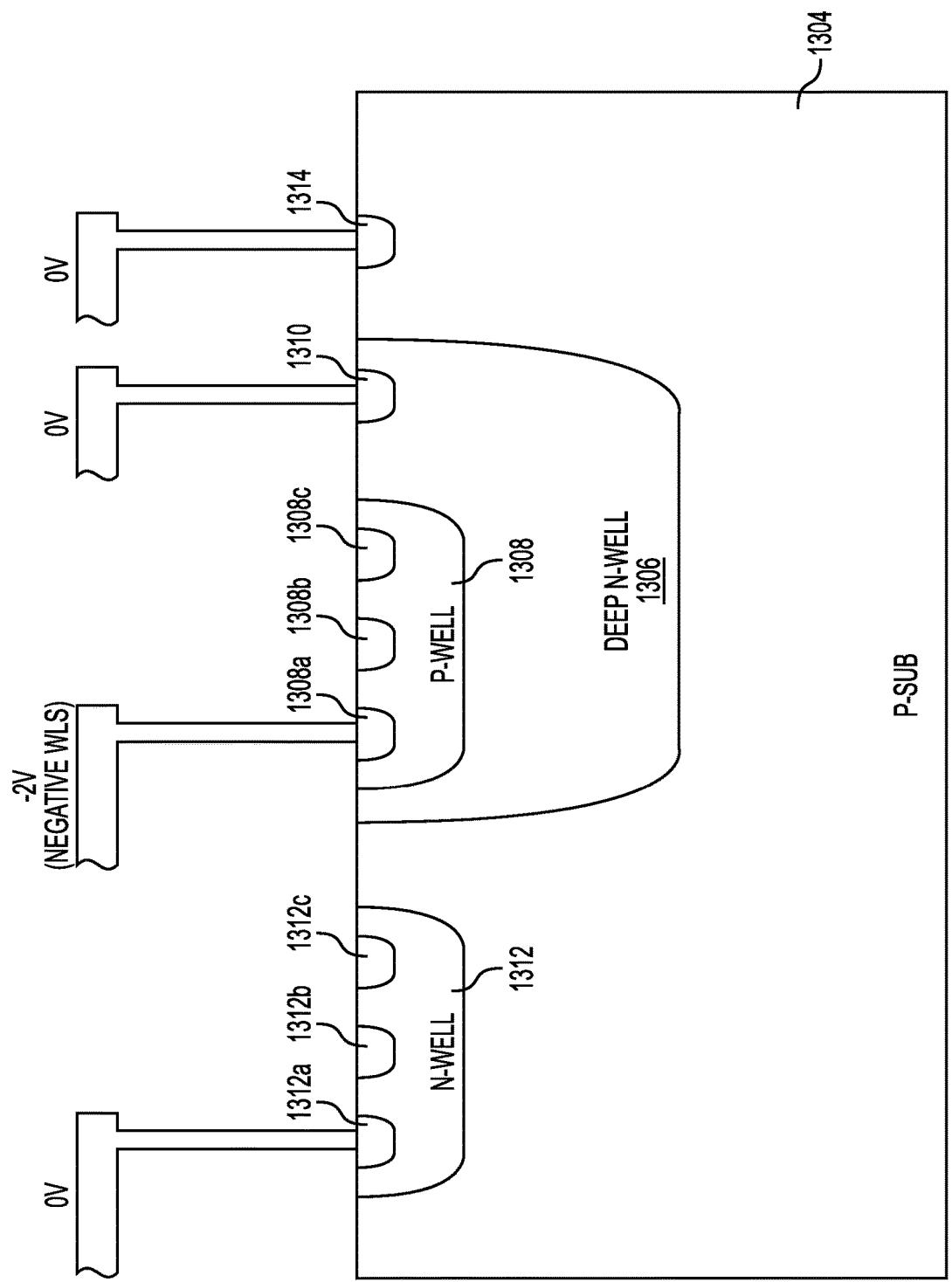
FIG. 13 illustrates a block diagram of an example triple-well technology in accordance with some embodiments.

In accordance with some embodiments herein, during a programming operation, a bit line (e.g., a local bit line) or a word-line can be coupled to a negative voltage. FIG. 13 illustrates, in block diagram form, triple-well technology implemented to generate negative voltages. In some embodiments, the substrate 1304 defines a P conductivity type silicon—e.g., p-substrate 1304. The p-substrate 1304 defines various regions including the deep n-well 1306. The deep n-well 1306, in turn, defines the p-well 1308 with three regions 1308a, 1308b, and 1308c. The deep n-well 1306 defines an additional region 210. In some examples, the region 1308a is a P-type region.

The p-substrate 1304 additionally defines an n-well region 1312. The n-well region 212 defines three regions 1312a, 1312b, and 1312c. Additionally, the p-substrate 1304 defines a well region 1314. As shown, the well region 1312a couples a line with 0 voltages, the well region 1308a couples a line with -2 voltages, the region 1310 couples a line with zero voltages, and the region 1314 couples a line with zero voltages.

Figure 14:
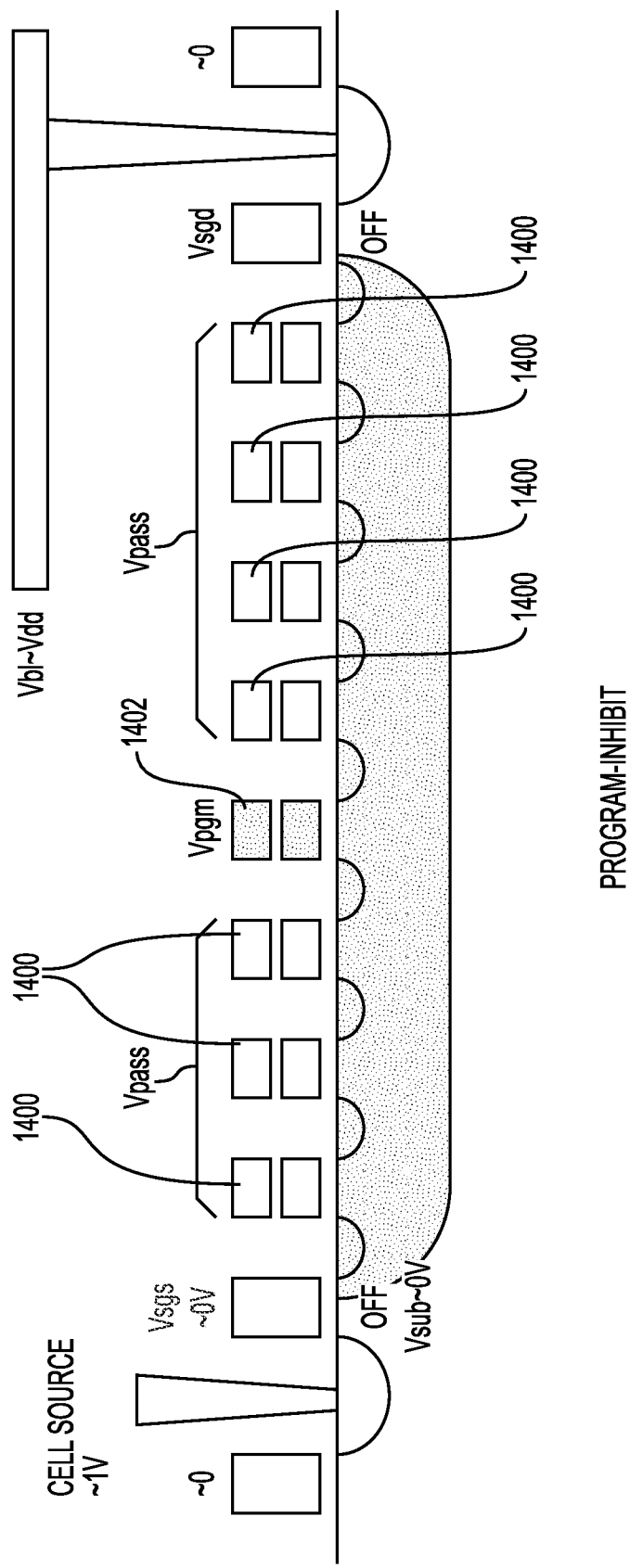
FIG. 14 is a schematic diagram illustrating a NAND string during a program inhibit operation.
Figure 15:
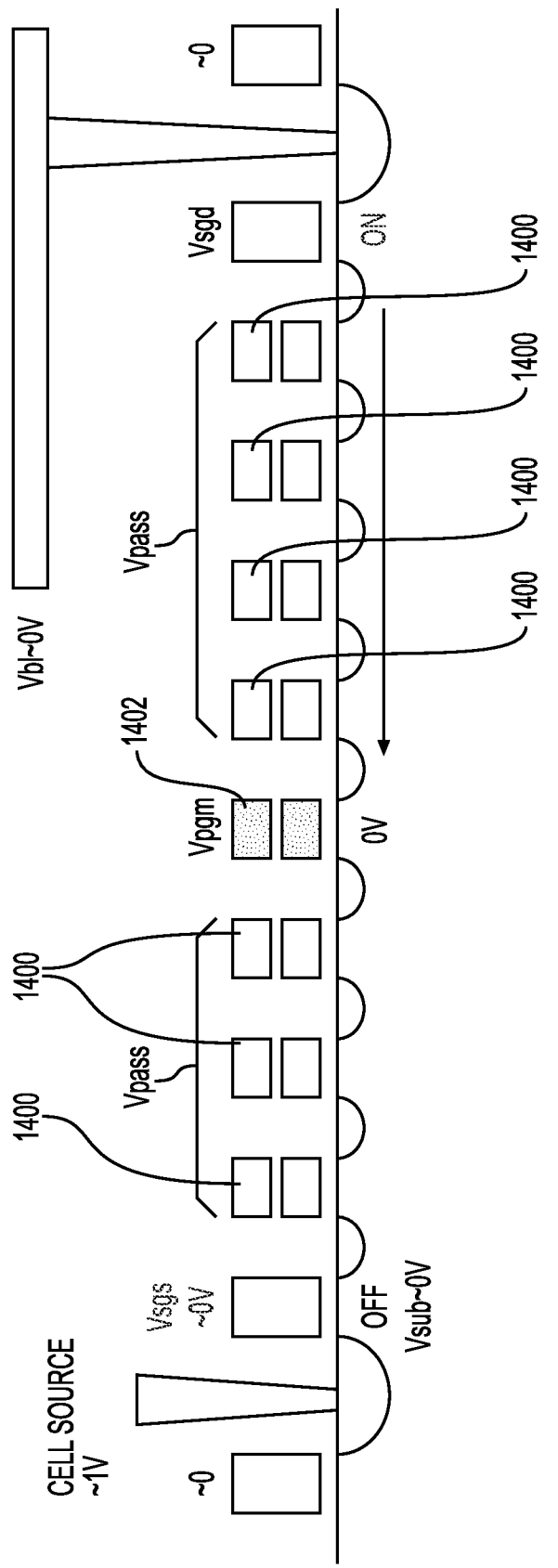
FIG. 15 is a schematic diagram illustrating a NAND string during a conventional programming operation.
Figure 16:
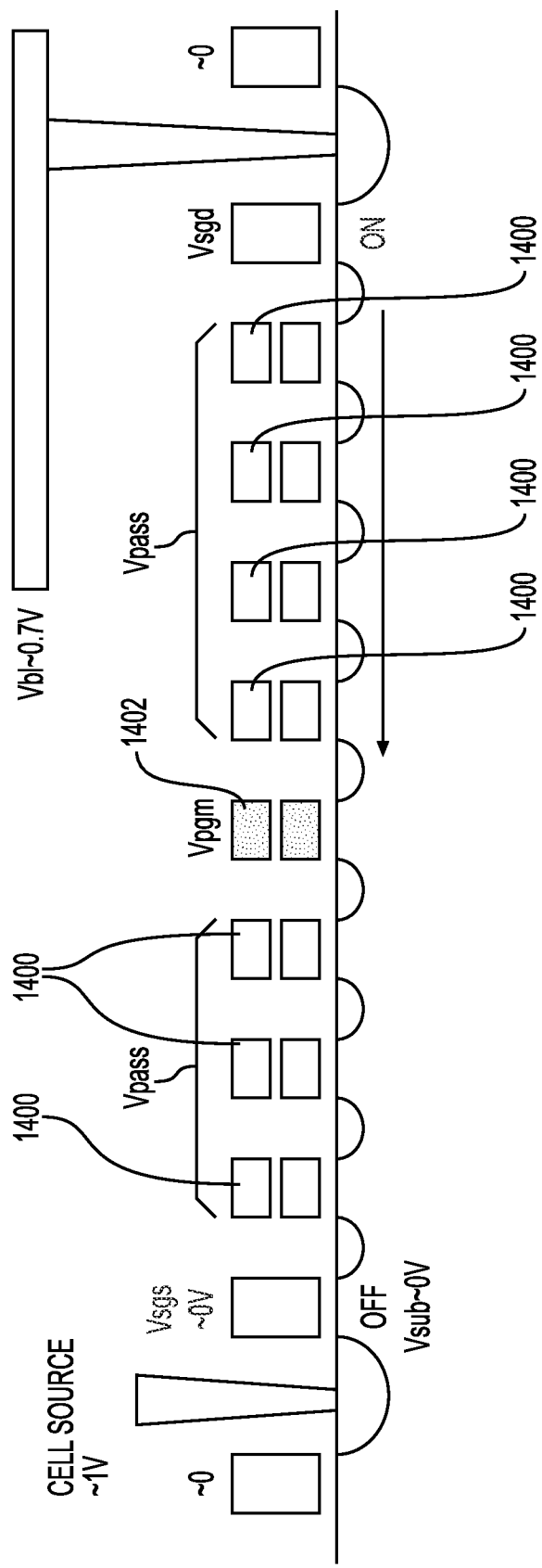
FIG. 16 is a schematic diagram illustrating a NAND string during a QPW programming operation.
Figure 17:
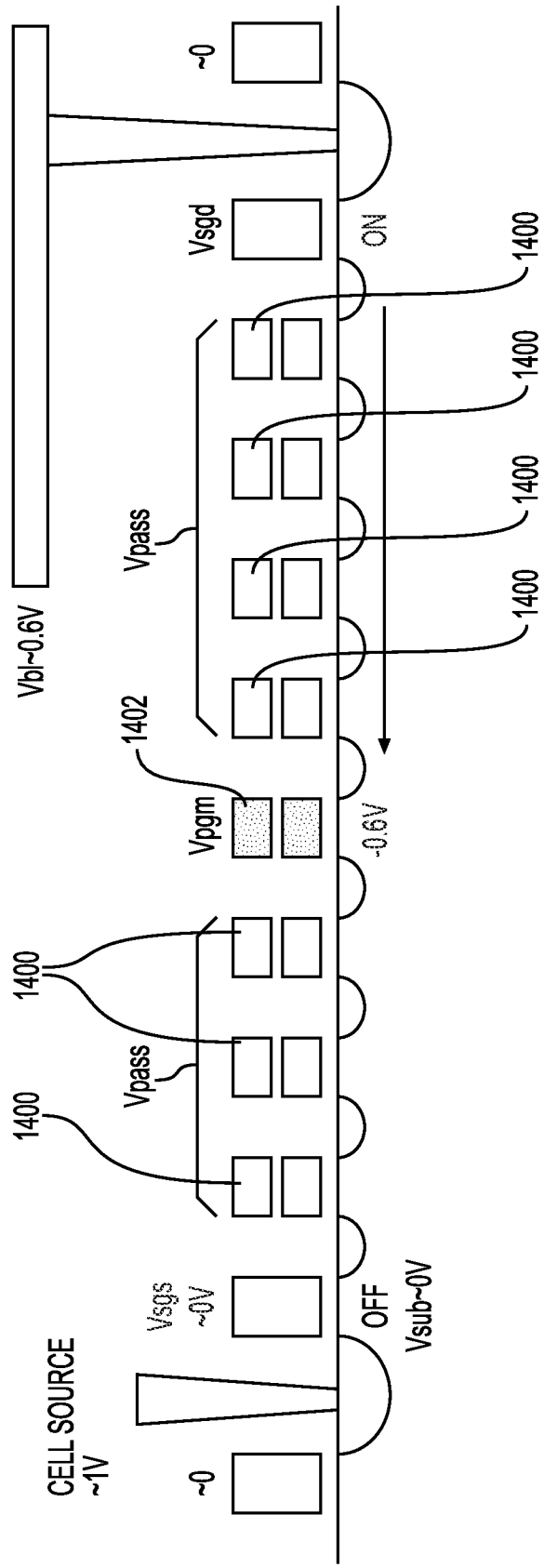
FIG. 17 is a schematic diagram illustrating a NAND string during a reverse QPW programming operation.

Referring now to FIGS. 14-17, FIG. 14 illustrates a string during a program inhibit operation for inhibiting programming of a memory cell in a bit line, and FIGS. 15-17 show strings in three different programming operations. Specifically, FIG. 15 shows a conventional programming operation, FIG. 16 shows a second programming operation (hereinafter referred to as a Quick Pass Write or QPW operation), and FIG. 17 shows a third programming operation (hereinafter referred to as a "reverse QPW" operation).

During a program loop of a word line, the controller may inhibit the programming of certain memory cells by implementing the program inhibit operation of FIG. 14 to the bit lines coupled to those memory cells. For an unselected string, both the SGS and SGD transistors are maintained in off conditions with a Vsgd that may be approximately 2.5 Volts. In this condition, the voltage differential of the channel is increased so that the differences between the voltages of the control gates of the word lines (Vpass for the unselected word lines 1400 and Vpgm for the selected word line 1402) and the channel are small such that no programming of the memory cells does not occur.

During the conventional programming operation shown in FIG. 15, for a selected string, the SGS transistor is set to off and the SGD transistor is set to on. Thus, the bitline voltage Vb1 passes through the channel to the memory cells, and the voltage difference between the control gate of the selected word line 1402 and the bit line voltage (Vpgm-Vb1) results in programming the target memory cell. In an example embodiment, Vpgm may be set to 12-24 V, Vb1 may be set to 0 V, and Vpass may be set to 5-10 V to inhibit programming of the cells in the unselected word lines.

As discussed in further detail below, as a memory cell approaches a target data state, programming is slowed down by applying a small bit line bias to the memory cell during the QPW programming operation shown in FIG. 16, thereby allowing for more accurate programming. In this embodiment, the bit line voltage Vb1 is increased, for example, by 0.7 V. A. Thus, if Vb1 is set to 0 V in the first programming operation, then it will be set to 0.7 V in the QPW programming operation. Accordingly, during in the QPW programming operation, the voltage difference at the selected word line 1402 between Vpgm and Vb1 is smaller as compared to the first programming operation of FIG. 15, and the programming speed is slowed so that more reliable programming can occur.

Referring now to FIG. 17, a reverse QPW programming operation is shown. In the reverse QPW programming operation, the bit line voltage Vb1 is set to a negative value (for example, −0.6 V), thereby increasing the voltage difference at the selected word line 1402 (Vpgm-Vb1) to increase programming speed as compared to the first programming operation shown in FIG. 15 and thereby boost performance of the memory system. As discussed in further detail below, in some embodiments, the controller may be configured to simultaneously operate the QPW programming condition on some bitlines and the reverse QPW programming condition on other bitlines while a single programming voltage Vpgm is applied to the same word line to both accurately and slowly program some memory cells Vth and to speed up programming of other memory cells that are being programmed to higher data states. The negative bit line voltages may be generated using triple-cell technology as described above.

Figure 18:
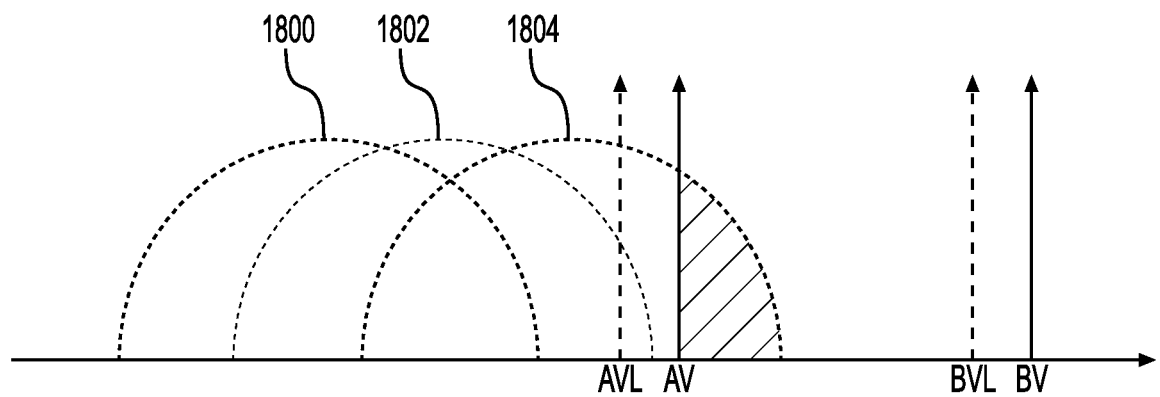
FIG. 18 illustrates a distribution of the voltages of a plurality of memory cells following three successive programming operations.
Figure 19:
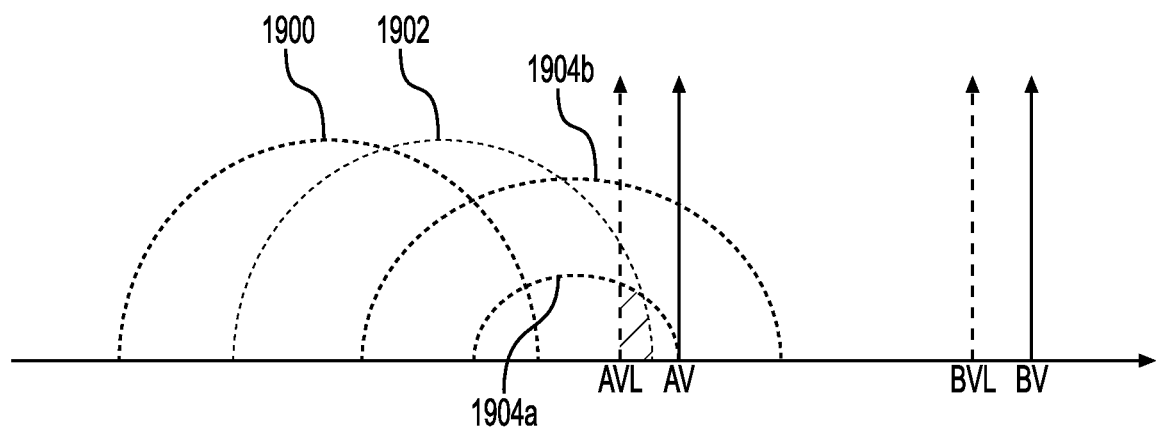
FIG. 19 illustrates a distribution of the voltages of a plurality of memory cells following three successive programming operations with the third programming operation being different than the third programming operation in FIG. 18.
Figure 20:
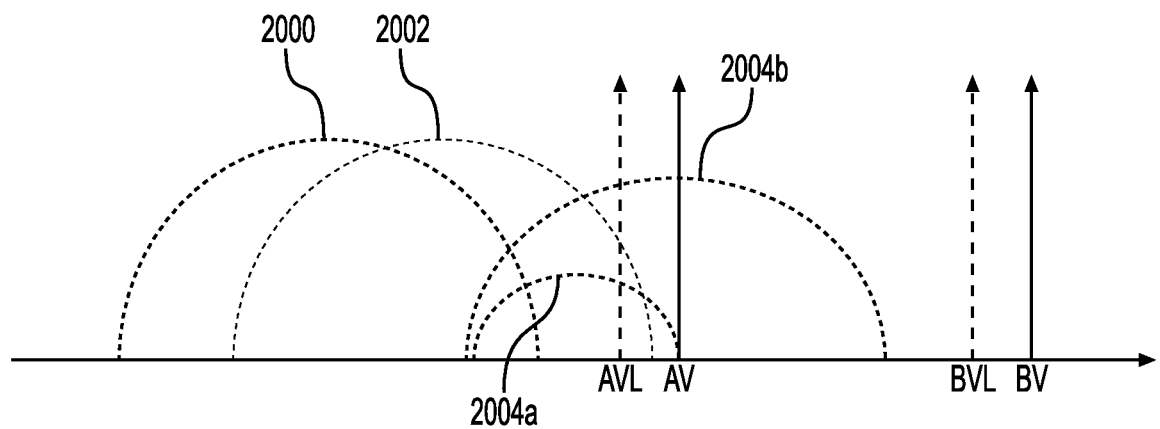
FIG. 20 illustrates a distribution of the voltages of a plurality of memory cells following three successive programming operations with the third programming operation being different than the third programming operations in FIGS. 18 and 19.

Referring now to FIGS. 18-20, each of these figures illustrates the Vt distributions of memory cells following three successive programming pulses, namely a first programming pulse 1800, 1900, 2000; a second programming pulse 1802, 1902, 2002, and a third programming pulse 1804, 1904, 2004. Between successive programming pulses, the programming voltage (Vpgm) applied to the selected word line is increased by a fixed amount, e.g., dVpgm. In FIG. 18, only the first programming operation shown in FIG. 15 is employed for all three programming pulses 1800, 1802, 1804. As shown, with each program pulse, the Vt distribution shifts rightward (higher voltage) by approximately a fixed amount.

In FIG. 19, following the second programming pulse 1902, the memory controller detects during the verify operation and/or a bitscan operation that some of the memory cells have exceeded the A data state verify level (AVL). On the third programming pulse 1904, the memory controller applies the QPW programming condition shown in FIG. 16 on a first subset of memory cells, which are being programmed to the A data state, and applies the conventional programming operation shown in FIG. 15 on a second subset of memory cells (the memory cells being programmed to the B data state and beyond). This results in the Vth distributions breaking into two groups: a Vth distribution 1904a for the first subset of memory cells and a Vth distribution 1904b for the second subset of memory cells. Due to the slower programming speed of the QPW programming condition, Vth distribution of the first subset of memory cells has, on average, advanced rightward (higher voltage) by a lesser amount than the Vth distribution 1904b of the second subset of memory cells. Thus, in comparison to the FIG. 18, the first subset of memory cells are programmed more slowly and accurately towards the A data state without slowing the advancement of the second subset of memory cells towards the B data state and beyond.

In FIG. 20, following the second programming pulse 2002, the memory controller detects that some memory cells have exceeded the A data state verify level (AVL). On the third programming pulse 2004, the memory controller applies the QPW programming operation shown in FIG. 16 on the first subset of memory cells (the memory cells being programmed to the A data state) and applies the reverse QPW programming operation shown in FIG. 17 on the second subset of memory cells (the memory cells being programmed to the B data state or higher). Thus, in comparison to FIG. 16, the Vth distribution 2004a of the first subset of memory cells is advanced rightward (higher voltage) by a lesser amount than the Vth distribution 1804 of FIG. 17, and the advancement of the Vth distribution 2004b of the second memory cells towards the B data states and beyond is greater than the advancement of the Vth distribution 1904b in FIG. 19. In other words, the first subset of memory cells are programmed slowly with high accuracy, and the second subset of memory cells are simultaneously programmed more quickly with high performance.

This process can be repeated in subsequent programming loops until programming of the first subset of memory cells is completed and beyond. For example, once programming of the A data state is completed, then the memory cells being programmed to the B data state may become the first subset of memory cells, and the memory cells being programmed to the C data state and beyond may become the second subset of memory cells. This process continues until programming of all of the data states is completed.

Figure 21:
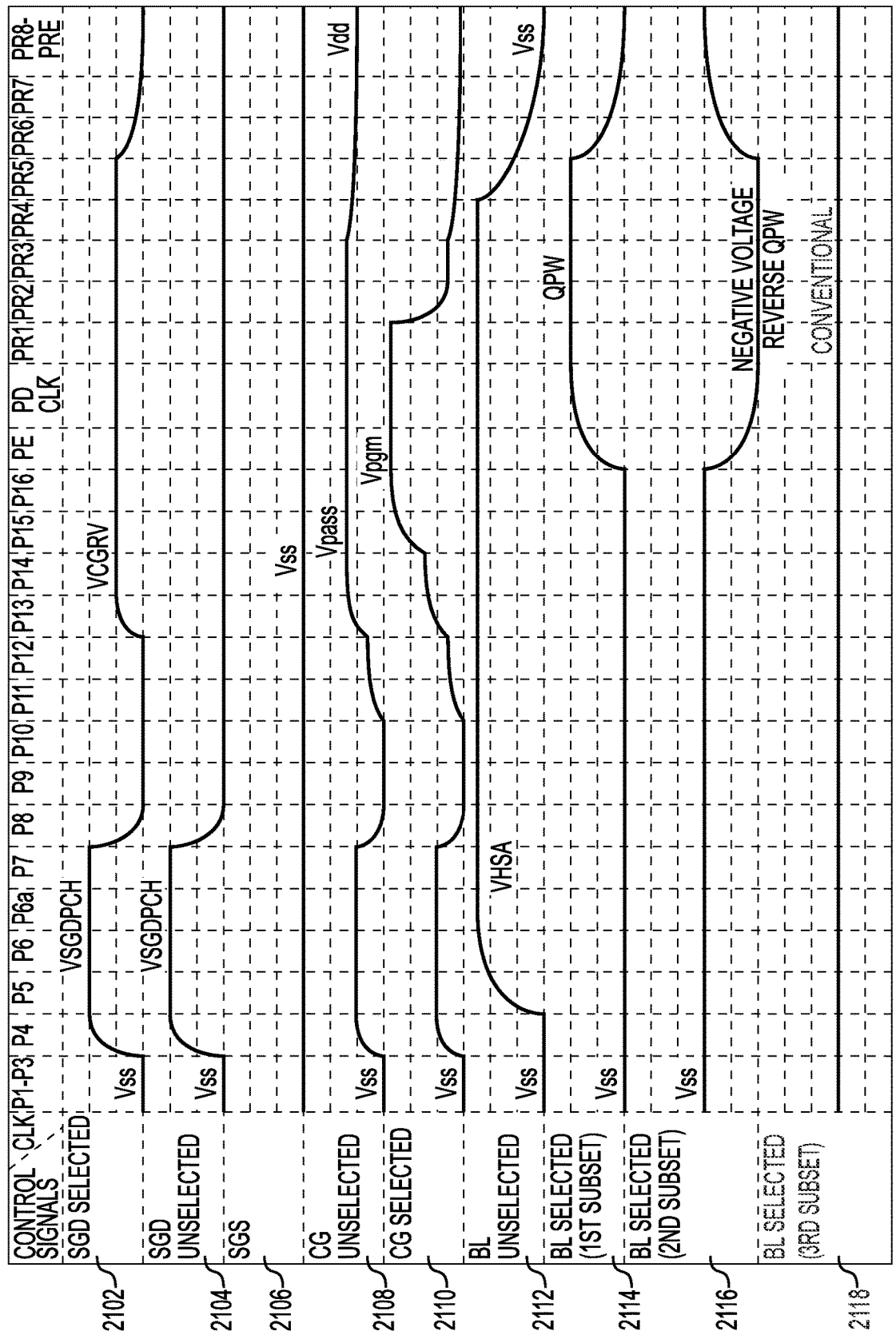
FIG. 21 illustrates a plot capturing various bitline voltage levels applied during a program loop, in accordance with some embodiments.

FIG. 21 illustrates a plot that captures various voltage levels during the various stages of a program loop where a first subset of cells is programmed according to the QPW programming condition and a second subset of cells is programmed according to the reverse QPW programming condition, e.g., the third programming pulse 2004 in FIG. 20. Specifically, FIG. 21 illustrates voltage levels applied to: a selected select gate drain "SGD" 2102, an unselected SGD 2104, a selected gate source "SGS" 2106, an unselected control gate "CG" 2108, a selected CG 2110, an unselected bit line "BL" 2112, a first selected BL 2114, and a second selected BL 2116, and a third selected BL 2118. The first selected BL 2114 is coupled to one of the first subset of memory cells, and the second selected BL 2116 is coupled to one of the second subset of memory cells. In other words, the first selected BL 2114 is coupled to a memory cell being programmed to a data state at a lower voltage threshold than the second selected BL 2116. The third selected BL 2118 is coupled to a memory cell of a third subset bring programmed to a data state that is at a voltage between the data states of the first and second subsets. In an example, the first selected BL 2114 is coupled to a memory cell being programmed to the A data state, the second selected BL 2116 is coupled to a memory cell being programmed to the C data state or beyond, and the third selected BL 2118 is coupled to a memory cell being programmed to the B data state. In another example, the first selected BL 2114 is coupled to a memory cell being programmed to the B data state, the second selected BL 2116 is coupled to a memory cell being programmed to the D data state or beyond, and the third selected BL 2118 is coupled to a memory cell being programmed to the C data state.

During the example program loop, the voltage levels on the selected and unselected SGDs 2102, 2104 can range between Vss, VSGDPCH, and VCGRV. As used herein, Vss refers to a voltage level provided by a ground pin of a positive supply voltage. In some examples, Vss is equal to a ground. In other examples, Vss is equal to a floating ground. In other examples, Vss is equal to zero voltages. As used herein, Vss is a non-negative voltage that includes zero voltages. Throughout the example program loop in FIG. 21, Vss is coupled to the SGS.

Still referring to FIG. 21, various voltage levels are coupled to the control gates 2108, 2110 of unselected and selected word lines respectively. As used herein, an unselected word line is one which is not programmed during the example program loop, e.g., including memory cells remaining in the ER data state or in data states for which programming has been completed. In contrast, a selected word line is one that includes one or more memory cells that are being programmed during the example program loop.

For the unselected word line, the corresponding control gate (unselected CG 2108) is initially at a voltage value of Vss. During the example program loop, the voltage value of the unselected CG 2108 progresses to a Vpass level and then gradually drops to Vdd during a verify operation. For both the memory cells of both the first and second subsets, the corresponding control gates (CG selected 2110) are initially at a voltage value of Vss. During the example program loop of FIG. 21, the voltage value of the selected CG 2110 progresses to a Vpgm voltage level and gradually drops back to Vss by the end of the program loops.

To implement concurrent programming (programming two or more memory cells simultaneously), the bit lines coupled to the selected memory cells (BL selected 2114, 2116) initially receive the voltage value Vss or a non-negative voltage value. Next, the voltage applied to BL selected 2114 is increased to QPW, and the voltage applied to BL selected 2116 is decreased to a negative voltage Reverse QPW. The third selected BL 2118 remains at the voltage value Vss.

Due to the larger difference between Vpgm and Reverse QPW as compared to the difference between Vpgm and QPW, the memory cell coupled to BL selected 2116 is programmed more quickly than the memory cell coupled to BL selected 2114, and the memory cell coupled to BL selected 2118 is programmed at an intermediate speed. Thus, these three memory cells are concurrently (simultaneously) programmed at three different rates: the memory cell of the second subset that is being programmed to the higher state (e.g., the C data state or greater) is programmed at the fastest speed, the memory cell of the first subset that is being programmed to the lower state (e.g., the A data state) is programmed at the slowest speed, and the memory cell of the third subset that is programmed to the intermediate state (e.g., the B data state) is programmed at an intermediate speed.

The repetition of concurrent programming both slowly and accurately in the first subset of memory cells and quickly with high performance in the second subset of memory cells across all programmed data states reduces the total number of program verify loops that are necessary to complete programming of the word line without sacrificing quality.

Figure 22:
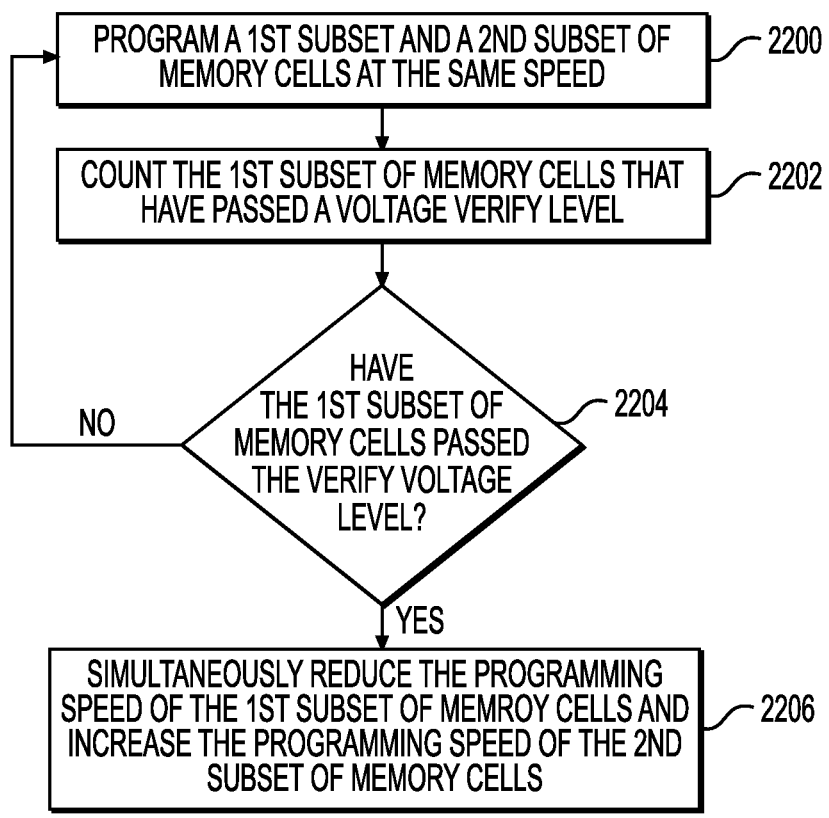
FIG. 22 is a flow chart illustrating the steps of an exemplary method of programming a plurality of memory cells in a memory system.

Referring now to FIG. 22, a flow chart depicting an exemplary method of operating a memory system is shown. At step 2200, the controller programs both the first and second subsets of memory cells at approximately the same speeds by applying a programming voltage to a selected word line and applying the same bitline voltage to the bitlines coupled to the memory cells of both the first and second subsets. The first subset of memory cells being programmed to a first data state (such as the A data state in FIG. 12), and the second subset of memory cells are being programmed to one or more data states at higher voltage levels than the first data state, e.g., the B data state or beyond in FIG. 12.

At step 2202, the controller counts the number of memory cells that have voltage thresholds above a very level (e.g., AVL in FIG. 20), e.g., during a bitscan operation. At decision step 2204, it is determined if a threshold number of the first subset of memory cells have voltage thresholds above the verify level.

If the answer at decision step 2204 is no, then the method returns to step 2200. If the answer at decision step 2204 is yes, then the method proceeds to step 2206. The determination at step 2202 may be made by a SPCV operation. Such an SPCV operation counts the upper tail of the bit distributions, i.e., the number of memory cells that exceed a verify level (e.g., AV in FIGS. 18-20) after a verify iteration. If the bit count number is below a threshold, the current verify iteration is continued; if the bit count is above the threshold, then a next stage is added of the verify operation. Thus, the result of the SPCV operation can be utilized to determine at step 2204 whether to proceed to step 2206 or to return to step 2200. At step 2206, the controller reduces the programming speed for the first subset of memory cells by increasing the bitline voltage applied to the bitlines coupled to the first subset of memory cells and increases the programming speed for the second subset of memory cells by decreasing the bitline voltage applied to the bitlines coupled to the second subset of memory cells.

The above discussion is meant to be illustrative of the principles and various embodiments described herein. Numerous variations and modifications will become apparent to those skilled in the art once the above disclosure is fully appreciated. In particular, the methods and techniques described herein as performed in the controller, may also be performed in a host. Furthermore, the methods and concepts disclosed herein may be applied to other types of persistent memories other than flash. It is intended that the following claims be interpreted to embrace all such variations and modifications.

What is claimed is:

1. A method of programming a memory apparatus, comprising the steps of:
   in a first programming loop;
      applying a first programming voltage to a control gate of a selected word line, and
      applying a first bitline voltage to a bitline that is coupled to a first memory cell that is being programmed to a first data state and to a different bitline that is coupled to a second memory cell that is being programmed to a second data state, and in a second programming loop;
   applying a second programming voltage to the control gate of the selected word line,
   simultaneously applying a second bitline voltage to the bitline coupled to the first memory cell and applying a third bitline voltage to the bitline coupled to the second memory cell, and
   the second bitline voltage being greater than the first bitline voltage to reduce a programming speed of the first memory cell and the third bitline voltage being less than the first bitline voltage to increase a programming speed of the second memory cell.

2. The method as set forth in claim 1, wherein the third bitline voltage is a negative voltage.

3. The method as set forth in claim 2, wherein the first memory cell is in a first subset of memory cells being programmed to a first data state and the second memory cell is in a second subset of memory cells being programmed to a second data state that is at a higher voltage than the first data state, and
   the second programming loop further including simultaneously applying the second bitline voltage to all bitlines coupled to the first subset of memory cells and applying the third bitline voltage to all bitlines coupled to the second subset of memory cells.

4. The method as set forth in claim 3, further including a third subset of memory cells being programmed to a third data state that is at a higher voltage than the second data state and further including a third programming loop, the third programming loop including;
   simultaneously applying the second bitline voltage to all bitlines coupled to the second subset of memory cells and applying the third bitline voltage to all bitlines coupled to the third subset of memory cells.

5. The method as set forth in claim 4, wherein the third programming loop further includes applying an inhibit bitline voltage to all bitlines coupled to the first subset of memory cells to inhibit programming of the first subset of memory cells during the third programming loop.

6. The method as set forth in claim 2, wherein the first bitline voltage is a ground voltage.

7. The method as set forth in claim 1, wherein the second programming loop further includes applying an inhibit bitline voltage to at least one bitline coupled to an additional memory cell to inhibit programming of the additional memory cell.

8. The method as set forth in claim 1, wherein the second programming voltage is greater than the first programming voltage.

9. An apparatus, comprising:
   a plurality of memory cells, each of the plurality of memory cells being connected to one of a plurality of word lines and one of a plurality of bit lines and being arranged in a plurality of blocks and configured to retain a threshold voltage corresponding to one of a plurality of data states;

a control circuit coupled to the plurality of word lines and the plurality of bit lines and configured to:
in a first programming loop;
apply a first programming voltage to a control gate of a selected word line, and
apply a first bitline voltage to a bitline coupled to a first memory cell being
programmed to a first data state and to a bitline coupled to a second memory cell being
programmed to a second data state, and
in a second programming loop;
apply a second programming voltage to a control gate of the selected word line,
simultaneously apply a second bitline voltage to the bitline coupled to the first memory cell and apply a third bitline voltage to the bitline coupled to the second memory cell,
the second bitline voltage being greater than the first bitline voltage to reduce a programming speed of the first memory cell and the third bitline voltage being less than the first bitline voltage to increase a programming speed of the second memory cell during the second programming loop.

10. The apparatus as set forth in claim 9, wherein the third bitline voltage is a negative voltage.

11. The apparatus as set forth in claim 10, wherein the first memory cell is in a first subset of memory cells being programmed to a first data state and the second memory cell is in a second subset of memory cells being programmed to a second data state that is at a higher voltage than the first data state, and
wherein during the second programming loop, the control circuit is configured to apply the second bitline voltage to all bitlines coupled to the first subset of memory cells and apply the third bitline voltage to all bitlines coupled to the second subset of memory cells.

12. The apparatus as set forth in claim 11, wherein the control circuit is further configured to perform a third programming loop and, in the third programming loop, simultaneously apply the second bitline voltage to all bitlines associated with the second subset of memory cells and apply the third bitline voltage to all bitlines coupled to a third subset of memory cells, the third subset of memory cells being programmed to a third data state that is at a higher voltage than the second data state.

13. The apparatus as set forth in claim 12, wherein the control circuit is further configured to, in third programming loop, apply an inhibit bitline voltage to all bitlines coupled to the first subset of memory cells to inhibit programming of the first subset of memory cells during the third programming loop.

14. The apparatus as set forth in claim 9, wherein the control circuit is further configured to, in the second programming loop, apply an inhibit bitline voltage to at least one bitline coupled to an additional memory cell to inhibit programming of the additional memory cell.

15. A controller in communication with a memory apparatus that includes a plurality of memory cells, each of the plurality of memory cells being connected to one of a plurality of word lines and one of a plurality of bit lines and being arranged in a plurality of blocks and configured to retain a threshold voltage corresponding to one of a plurality of data states, the controller being configured to:
in a first programming loop;
apply a first programming voltage to a control gate of a selected word line, and
apply a first bitline voltage to a bitline coupled to a first memory cell being programmed to a first data state and to a bitline coupled to a second memory cell being programmed to a second data state, and
in a second programming loop;
apply a second programming voltage to the control gate of the selected word line,
simultaneously apply a second bitline voltage to the bitline coupled to the first memory cell and apply a third bitline voltage to the bitline coupled to the second memory cell,
the second bitline voltage being greater than the first bitline voltage to reduce a programming speed of the first memory cell and the third bitline voltage being less than the first bitline voltage to increase a programming speed of the second memory cell.

16. The controller as set forth in claim 15, wherein the third bitline voltage is a negative voltage.

17. The controller as set forth in claim 16, wherein the first memory cell is in a first subset of memory cells being programmed to a first data state and the second memory cell is in a second subset of memory cells being programmed to a second data state that is at a higher voltage than the first data state, and
wherein during the second programming loop, the controller is configured to apply the second bitline voltage to all bitlines coupled to the first subset of memory cells and apply the third bitline voltage to all bitlines coupled to the second subset of memory cells.

18. The controller as set forth in claim 17, wherein the controller is further configured to perform a third programming loop and, in the third programming loop, simultaneously apply the second bitline voltage to all bitlines associated with the second subset of memory cells and apply the third bitline voltage to all bitlines coupled to a third subset of memory cells, the third subset of memory cells being programmed to a third data state that is at a higher voltage than the second data state.

19. The controller as set forth in claim 18, wherein the controller is further configured to, in third programming loop, apply an inhibit bitline voltage to all bitlines coupled to the first subset of memory cells to inhibit programming of the first subset of memory cells during the third programming loop.

20. The controller as set forth in claim 15, wherein the controller is further configured to, in the second programming loop, apply an inhibit bitline voltage to at least one bitline coupled to an additional memory cell to inhibit programming of the additional memory cell.

* * * * *